United States Patent
Weber

(10) Patent No.: US 11,001,522 B2
(45) Date of Patent: May 11, 2021

(54) METHODS FOR THINNING GLASS

(71) Applicant: CORNING INCORPORATED, Corning, NY (US)

(72) Inventor: Craig Steven Weber, Erin, NY (US)

(73) Assignee: Corning Incorporated, Corning, NY (US)

(*) Notice: Subject to any disclaimer, the term of this patent is extended or adjusted under 35 U.S.C. 154(b) by 305 days.

(21) Appl. No.: 16/072,985

(22) PCT Filed: Jan. 26, 2017

(86) PCT No.: PCT/US2017/015012
§ 371 (c)(1),
(2) Date: Jul. 26, 2018

(87) PCT Pub. No.: WO2017/132303
PCT Pub. Date: Aug. 3, 2017

(65) Prior Publication Data
US 2019/0047906 A1    Feb. 14, 2019

Related U.S. Application Data

(60) Provisional application No. 62/288,773, filed on Jan. 29, 2016.

(51) Int. Cl.
*C03C 15/00* (2006.01)
*H01L 21/67* (2006.01)

(52) U.S. Cl.
CPC .......... *C03C 15/00* (2013.01); *H01L 21/6708* (2013.01)

(58) Field of Classification Search
None
See application file for complete search history.

(56) References Cited

U.S. PATENT DOCUMENTS

| | | | |
|---|---|---|---|
| 4,806,192 A * | 2/1989 | Haas | C23F 1/08 134/10 |
| 4,985,111 A * | 1/1991 | Ketelhohn | B05B 12/02 156/345.21 |
| 5,807,062 A | 9/1998 | Schultz et al. | |
| 6,197,209 B1 | 3/2001 | Shin et al. | |

(Continued)

FOREIGN PATENT DOCUMENTS

| CN | 101007710 A | 8/2007 |
|---|---|---|
| CN | 102076625 A | 5/2011 |

(Continued)

OTHER PUBLICATIONS

CN 104379527 A (Nishiyama) Feb. 25, 2015 (English language machine translation), [online] [retrieved Nov. 30, 2020], Retrieved from: Espacenet. (Year: 2015).*

(Continued)

*Primary Examiner* — Erin Snelting
(74) *Attorney, Agent, or Firm* — Jeffrey A. Schmidt

(57) ABSTRACT

Methods for thinning glass are provided, including methods for reducing a thickness of a glass sheet by subjecting the glass sheet to an etching process. The methods can include passing the glass sheet through an etching zone along a conveyance path a plurality of times until an initial thickness of the glass sheet is reduced to a final predetermined thickness of the glass sheet, and washing the glass sheet after each pass through the etching zone.

22 Claims, 7 Drawing Sheets

(56) References Cited

U.S. PATENT DOCUMENTS

| | | | |
|---|---|---|---|
| 2002/0139475 A1* | 10/2002 | Chen | C03C 15/00 156/345.23 |
| 2006/0144822 A1* | 7/2006 | Gau | H01L 21/67173 216/83 |
| 2007/0034228 A1* | 2/2007 | Devitt | H01J 37/3277 134/1 |
| 2008/0044956 A1 | 2/2008 | Takechi | |
| 2009/0020503 A1* | 1/2009 | Kim | C03C 15/00 216/23 |
| 2009/0039054 A1* | 2/2009 | Choi | H01L 21/6708 216/24 |
| 2014/0051257 A1* | 2/2014 | Pilch | H01L 22/26 438/745 |
| 2016/0347643 A1* | 12/2016 | Yamauchi | C03C 15/00 |

FOREIGN PATENT DOCUMENTS

| | | |
|---|---|---|
| CN | 203360279 U | 12/2013 |
| CN | 104379527 A | 2/2015 |
| JP | 06-227842 A | 8/1994 |
| JP | 2006265017 A | 10/2006 |
| JP | 2007-001789 A | 1/2007 |
| JP | 2007197236 A | 8/2007 |
| JP | 2008-266135 A | 11/2008 |
| JP | 2013-001593 A | 1/2013 |
| KR | 101469000 B1 * | 12/2014 |
| WO | 2009157378 A1 | 12/2009 |

OTHER PUBLICATIONS

English Translation of TW106102519 Office Action dated May 8, 2020; 2 pages; Taiwan Patent Office.

International Search Report and Written Opinion of the International Searching Authority; PCT/US2017/015012; dated April 11, 2017; 11 pages; European Patent Office.

English Translation of CN201780008960.4 Office Action dated Jul. 27, 2020; 14 pages; Chinese Patent Office.

Japanese Patent Application No. 2018-539114, Office Action dated Dec. 9, 2020, 11 pages (5 pages of English Translation and 6 pages of Original Document); Japanese Patent Office.

* cited by examiner

METHODS FOR THINNING GLASS

CROSS-REFERENCE TO RELATED APPLICATIONS

This application claims the benefit of priority under 35 U.S.C. § 371 of International Patent Application Serial No. PCT/US2017/015012, filed on Jan. 26, 2017, which in turn, claims the benefit of priority of U.S. Provisional Patent Application Ser. No. 62/288,773 filed on Jan. 29, 2016, the contents of each of which are relied upon and incorporated herein by reference in their entireties.

FIELD

The present disclosure relates generally to methods for thinning glass and, more particularly, to methods for reducing a thickness of a glass sheet by subjecting the glass sheet to an etching process.

BACKGROUND

Glass sheets are commonly used, for example, in various applications, such as display applications, including liquid crystal displays (LCDs), electrophoretic displays (EPD), organic light emitting diode displays (OLEDs), plasma display panels (PDPs), or the like.

Glass sheets can be formed by various glass forming techniques including slot draw, float, down-draw, fusion down-draw, and up-draw. In some applications, it may be desirable to provide ultra-thin glass sheets having a thickness that is less than a thickness that can be easily achieved by the various existing glass forming techniques. For example, ultra-thin glass sheets with a thickness of less than or equal to 300 microns, less than or equal to 200 microns, less than or equal to 100 microns, less than or equal to 75 microns, or less than or equal to 50 microns can have enhanced flexibility when compared to relatively thick glass sheets having a thickness greater than 300 microns. The ultra-thin glass sheets can therefore achieve a relatively small bend radius without generating unacceptable levels of stress that may otherwise occur in the relatively thick glass sheets. Accordingly, ultra-thin glass sheets may be particularly suitable for applications, including various display applications, that include bending and folding of a glass sheet.

To produce ultra-thin glass sheets, it is known to first generate a high-quality glass sheet using conventional glass forming techniques. The glass sheet, having an initial thickness, can then subjected to processing techniques to reduce the initial thickness to achieve an ultra-thin glass sheet with a final desired thickness. Existing techniques of thinning a glass sheet often involve vertically etching the glass sheet in a vertical bath process followed by mechanically polishing the glass sheet to improve uniformity of thickness (e.g., reduce thickness variability) and to improve optical qualities of the glass sheet. However, it may be difficult or, in some instances, not possible to use these existing processing techniques to reduce the initial thickness of the glass sheet while also satisfying the relatively tight tolerance control, reduced thickness variability, and enhanced optical clarity parameters that are desirable in certain applications.

SUMMARY

The present disclosure provides methods for reducing a thickness of a previously-formed glass sheet to provide a high-quality, ultra-thin glass sheet that has a relatively tight tolerance control, reduced thickness variability, and enhanced optical clarity that may otherwise not be achieved by conventional glass thinning techniques. The concepts of the present disclosure may be carried out according to one or more of the example embodiments set forth below.

Embodiment 1

A method of reducing a thickness of a glass sheet by subjecting the glass sheet to an etching process comprising the steps of:
passing the glass sheet through an etching zone along a conveyance path a plurality of times until an initial thickness of the glass sheet is reduced to a final predetermined thickness of the glass sheet; and
washing the glass sheet after each pass through the etching zone.

Embodiment 2

The method of embodiment 1, wherein the etching zone comprises a plurality of etching zones, the glass sheet is passed through each of the plurality of etching zones along the conveyance path at least once to comprise the plurality of times, and the glass sheet is washed after each pass through each of the plurality of etching zones.

Embodiment 3

The method of embodiment 1 or embodiment 2, further comprising the steps of:
exposing a first major surface of the glass sheet to a first etchant and exposing a second major surface of the glass sheet to a second etchant during a first pass of the glass sheet through the etching zone; and then
exposing the first major surface of the glass sheet to the second etchant and exposing the second major surface of the glass sheet to the first etchant during a subsequent pass of the glass sheet through the etching zone.

Embodiment 4

The method of embodiment 3, wherein the first etchant is provided to the glass sheet from a top sprayer arranged above the conveyance path, and wherein the second etchant is provided to the glass sheet from a bottom sprayer arranged below the conveyance path.

Embodiment 5

The method of embodiment 4, wherein a first flow rate of the first etchant from the top sprayer is less than a second flow rate of the second etchant from the bottom sprayer.

Embodiment 6

The method of any one of embodiments 1-5, further comprising the step of:
flipping the glass sheet by rotating the glass sheet 180 degrees about an axis parallel to a major surface of the glass sheet between two consecutive passes through the etching zone.

Embodiment 7

The method of embodiment 6, further comprising the step of:

reorienting the glass sheet by rotating the glass sheet 180 degrees about an axis perpendicular to the major surface of the glass sheet prior to a subsequent pass through the etching zone.

Embodiment 8

The method of any one of embodiments 1-5, further comprising the step of:
reorienting the glass sheet by rotating the glass sheet 180 degrees about an axis perpendicular to a major surface of the glass sheet between two consecutive passes through the etching zone.

Embodiment 9

The method of any one of embodiments 1-5, further comprising the step of:
at least one of flipping the glass sheet by rotating the glass sheet 180 degrees about an axis parallel to a major surface of the glass sheet and reorienting the glass sheet by rotating the glass sheet 180 degrees about an axis perpendicular to a major surface of the glass sheet between each consecutive pass through the etching zone.

Embodiment 10

The method of any one of embodiments 1-9, wherein the glass sheet comprising the final predetermined thickness comprises a DOI that is greater than or equal to about 98.5.

Embodiment 11

The method of embodiment 10, wherein the DOI is obtained without subjecting the glass sheet to a mechanical polishing process.

Embodiment 12

The method of any one of embodiments 1-11, wherein at least one of a thickness variability of the final predetermined thickness of the glass sheet is from about 3 microns to about 9 microns and an absolute value of a difference between a first thickness variability of the initial thickness of the glass sheet and a second thickness variability of the final predetermined thickness of the glass sheet is from about 0 microns to about 7 microns.

Embodiment 13

The method of embodiment 12, wherein the at least one of the thickness variability and the first thickness variability and the second thickness variability is obtained without subjecting the glass sheet to a mechanical polishing process.

Embodiment 14

The method of any one of embodiments 1-13, further comprising the step of:
controlling the etching process to reduce the thickness of the glass sheet by about 20 microns to about 40 microns per each pass of the glass sheet through the etching zone.

Embodiment 15

The method of any one of embodiments 1-14, further comprising the step of:
controlling the etching process to reduce the thickness of the glass sheet at a rate of from about 10 microns/min to about 20 microns/min per each pass of the glass sheet through the etching zone.

Embodiment 16

The method of any one of embodiments 1-13, wherein a difference between the initial thickness of the glass sheet and the final predetermined thickness of the glass sheet is greater than 0 microns and less than or equal to about 150 microns, further comprising the steps of:
controlling the etching process to reduce the thickness of the glass sheet by about 20 microns to about 40 microns per each pass of the glass sheet through the etching zone; and
controlling the etching process to reduce the thickness of the glass sheet at a rate of from about 10 microns/min to about 15 microns/min per each pass of the glass sheet through the etching zone.

Embodiment 17

The method of any one of embodiments 1-13, wherein a difference between the initial thickness of the glass sheet and the final predetermined thickness of the glass sheet is greater than 0 microns and less than or equal to about 150 microns, further comprising the steps of:
controlling the etching process to reduce the thickness of the glass sheet by about 20 microns to about 30 microns per each pass of the glass sheet through the etching zone; and
controlling the etching process to reduce the thickness of the glass sheet at a rate of from about 10 microns/min to about 20 microns/min per each pass of the glass sheet through the etching zone.

Embodiment 18

The method of any one of embodiments 1-13, wherein a difference between the initial thickness of the glass sheet and the final predetermined thickness of the glass sheet is greater than about 150 microns and less than or equal to about 300 microns, further comprising the steps of:
controlling the etching process to reduce the thickness of the glass sheet by about 20 microns to about 30 microns per each pass of the glass sheet through the etching zone; and
controlling the etching process to reduce the thickness of the glass sheet at a rate of from about 10 microns/min to about 15 microns/min per each pass of the glass sheet through the etching zone.

Embodiment 19

The method of any one of embodiments 1-13, wherein a difference between the initial thickness of the glass sheet and the final predetermined thickness of the glass sheet is greater than about 150 microns and less than or equal to about 300 microns, further comprising the steps of:
controlling the etching process to reduce the thickness of the glass sheet by about 20 microns per each pass of the glass sheet through the etching zone; and
controlling the etching process to reduce the thickness of the glass sheet at a rate of from about 10 microns/min to about 20 microns/min per each pass of the glass sheet through the etching zone.

Embodiment 20

The method of any one of embodiments 1-13, wherein a difference between the initial thickness of the glass sheet and the final predetermined thickness of the glass sheet is greater than about 300 microns, further comprising the steps of:

controlling the etching process to reduce the thickness of the glass sheet by greater than 0 microns to less than about 30 microns per each pass of the glass sheet through the etching zone; and controlling the etching process to reduce the thickness of the glass sheet at a rate of from about 10 microns/min to about 15 microns/min per each pass of the glass sheet through the etching zone.

Embodiment 21

The method of any one of embodiments 1-20, wherein during the step of passing the glass sheet through the etching zone, the glass sheet is exposed to an etchant comprising about 10% HF to about 20% HF.

Embodiment 22

The method of any one of embodiments 1-20, wherein during the step of passing the glass sheet through the etching zone, the glass sheet is exposed to an etchant comprising about 15% HF to about 20% HF.

Embodiment 23

The method of any one of embodiments 1-20, wherein during the step of passing the glass sheet through the etching zone, the glass sheet is exposed to an etchant comprising about 15% HF.

BRIEF DESCRIPTION OF THE DRAWINGS

The above and other features, aspects, and advantages of embodiments of the present disclosure are better understood when the following detailed description of the disclosure is read with reference to the accompanying drawings, in which.

Figure 1:
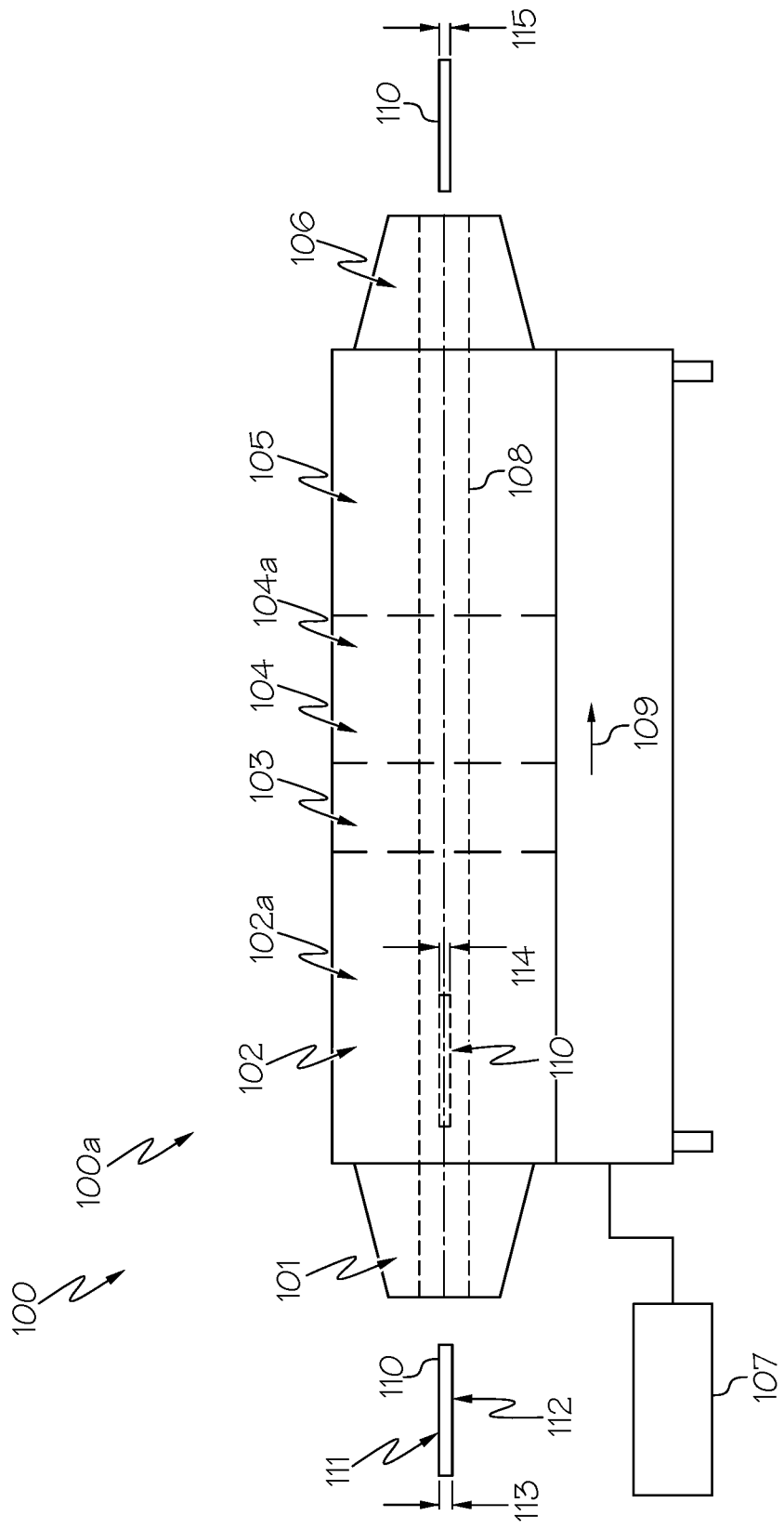
FIG. 1 shows a schematic illustration of a side view of an exemplary glass etcher in accordance with embodiments described herein.

Directional terms as used herein (e.g., up, down, right left, front, back, top, bottom) are made only with reference to the figures as drawn and are not intended to imply absolute orientation.

DETAILED DESCRIPTION

The subject matter of the present disclosure will now be described more fully hereinafter with reference to the accompanying drawings in which exemplary embodiments of the claimed subject matter are shown. Whenever possible, the same reference numerals are used throughout the drawings to refer to the same or like parts. However, the claimed subject matter may be embodied in many different forms and should not be construed as limited to the embodiments set forth herein. The exemplary embodiments are provided so that the present disclosure will be both thorough and complete, and will fully convey the scope of the claimed subject matter to those skilled in the art.

Among other characteristics, glass can include high scratch resistance, high strength, high durability, and high optical clarity, making glass suitable to be employed in a variety of applications including, for example, the commercial electronics and display industries. Such applications can include a cover glass for cellular phones, tablets, notebooks, televisions, monitors, and other devices with touch functionality and viewing capabilities. As technology advances, devices can be made thinner and lighter. In addition, some applications may require glass that can be curved, flexible, bendable, and foldable. An ultra-thin glass (e.g., a glass having a thickness less than or equal to 300 microns, less than or equal to 200 microns, less than or equal to 100 microns, less than or equal to 75 microns, or less than or equal to 50 microns) can be provided for certain applications. In other embodiments, the glass (e.g., the ultra-thin glass) can be chemically strengthened. Still further, as compared to some materials (e.g., polymer and plastic materials), glass can have a higher optical transmission, a higher abrasion resistance, and a higher solvent durability.

In some embodiments, it can be desirable to control at least one of a thickness of the glass, a thickness uniformity of the glass, an optical clarity of the glass, and a strength of the glass. For example, the thickness of the glass can directly relate to a bending stress of the glass, where a thinner glass will result in a lower bending stress for a given bend radius. Similarly, a corresponding bending stiffness of the glass can be reduced as the thickness of the glass is decreased. Accordingly, thin glass can be desirable for various applications, including applications requiring a flexible glass subjected to bending and other induced stresses. Glass can be commonly fabricated by flowing molten glass to a forming body whereby a glass ribbon may be formed by a variety of ribbon forming processes, for example, slot draw, float, down-draw, fusion down-draw, or up-draw. The glass ribbon may then be subsequently divided to provide sheets of glass suitable for further processing into a desired display application. After being formed, a thickness of the glass sheet may be reduced (e.g., thinned) using a variety of techniques. The present disclosure relates to methods and apparatus of etching, which includes applying a chemical (e.g., an acid, a corrosive chemical) to the glass to remove material and reduce a thickness of the glass. In some embodiments, etching can be performed on a glass sheet that has undergone processing prior to the etching process. In other embodiments, etching can be performed on a glass sheet that is in an as-formed state, having undergone no processing prior to the etching process.

As shown in FIG. 1, a glass etcher 100 in accordance with some embodiments disclosed herein is schematically illustrated. The glass etcher 100 can reduce a thickness 114 of a glass sheet 110 by subjecting the glass sheet 110 to an etching process 100*a*. The glass sheet 110 can include a first major surface 111 and a second major surface 112 a distance between which defines the thickness 114 of the glass sheet 110. Additionally, the glass sheet 110 can have an initial thickness 113, prior to being subjected to the etching process 100a, and a final predetermined thickness 115, after being subjected to the etching process 100a one or more times. By reducing the thickness 114 of the glass sheet 110, the final predetermined thickness 115 of the glass sheet 110 can be less than the initial thickness 113 of the glass sheet 110.

Regarding the term thickness (e.g., initial thickness 113, thickness 114, final predetermined thickness 115) as used herein to refer to a thickness of the glass sheet 110, unless otherwise noted, it is to be understood that such term is intended to refer to an average thickness of the glass sheet 110. For example, an actual thickness between the first major surface 111 of the glass sheet 110 and the second major surface 112 of the glass sheet 110 can be measured at nine locations on the glass sheet 110 (e.g., top left, top center, top right, middle left, middle, middle right, bottom left, bottom center, and bottom right) and averaged to determine the thickness (e.g., initial thickness 113, thickness 114, final predetermined thickness 115) of the glass sheet 110. In addition, the thickness variability, including an initial thickness variability of the initial thickness 113 of the glass sheet 110 and a final thickness variability of the final predetermined thickness 115 of the glass sheet 110, unless otherwise noted, is to be understood to correspond to a Total Thickness Variability (TTV) defined as a difference between a maximum dimension and a minimum dimension of the glass sheet 110 (e.g., a maximum actual thickness obtained from one of the nine locations minus a minimum actual thickness obtained from one of the nine locations). Likewise, the uniformity, unless otherwise noted, is to be understood to correspond to a difference between the maximum dimension and the minimum dimension divided by the sum of the maximum dimension and the minimum dimension.

An optical surface quality can be determined based on a Distinctness of Image (DOI) standard as is known in the art. DOI, unless otherwise noted, is a unitless number intended to refer to a quantification of the deviation of the direction of light propagation from the regular direction (e.g., specular reflected angle) by scattering during transmission or reflection. DOI can describe visual distortion (e.g., blur) of a reflected or transmitted image from or through a surface. A DOI of 100 can be defined for a surface which reflects or transmits an image perfectly without any distortion, while a DOI of zero can be defined for a surface that exhibits no image clarity. In some embodiments, an unacceptable DOI value can correspond, on a micro-scale, to an observed orange peel appearance on the glass. Any of the above values can be obtained, measured, gathered, and otherwise determined by any one or more of an optical, mechanical, or surface indication measurement device or technique. In some embodiments, unless otherwise noted, specific DOI values presented herein were obtained using a Rhopoint IQ (Goniophotometer) handheld meter, available from Rhopoint Instruments, St. Leonards on Sea, East Sussex, UK.

In some embodiments, the initial thickness 113 of the glass sheet 110 can be from about 100 microns to about 700 microns, for example from about 200 microns to about 700 microns, for example from about 300 microns to about 700 microns, for example from about 400 microns to about 700 microns, for example from about 500 microns to about 700 microns, and for example from about 600 microns to about 700 microns. In some embodiments, the final predetermined thickness 115 of the glass sheet 110 can be from about 40 microns to less than 700 microns, for example from about 40 microns to about 600 microns, for example from about 40 microns to about 500 microns, for example from about 40 microns to about 400 microns, for example from about 40 microns to about 300 microns, for example from about 40 microns to about 250 microns, and for example from about 40 microns to about 200 microns. In further embodiments, the final predetermined thickness 115 of the glass sheet 110 can be from about 40 microns to about 150 microns, for example from about 50 microns to about 150 microns, for example from about 75 microns to about 150 microns, for example, from about 100 microns to about 150 microns. In still further embodiments, the final predetermined thickness 115 of the glass sheet 110 can be from about 40 microns to about 100 microns, for example from about 50 microns to about 100 microns, for example from about 75 microns to about 100 microns. In yet further embodiments, the final predetermined thickness 115 of the glass sheet 110 can be from about 40 microns to about 75 microns, for example from about 50 microns to about 75 microns, for example from about 40 microns to about 50 microns.

It is to be understood that the methods and apparatus disclosed herein can be employed to thin any glass having any initial thickness 113 to any final predetermined thickness 115, including initial thicknesses 113, ranges, and subranges, as well as final predetermined thicknesses 115, ranges, and subranges not explicitly disclosed herein.

Methods and apparatus for thinning glass, including methods and apparatus for reducing a thickness 114 of a glass sheet 110 by subjecting the glass sheet 110 to an etching process 100a are disclosed herein. It is to be understood that the methods and apparatus disclosed herein can be performed to control various characteristics or properties of the glass to achieve a glass sheet 110 having desired dimensions (e.g., final predetermined thickness 115), desired dimensional variability (e.g., thickness uniformity), and desired optical clarity (e.g., DOI) with or without post-etch processing (e.g., mechanical polishing). For example, the methods and apparatus for thinning glass, including methods and apparatus for reducing a thickness 114 of a glass sheet 110 by subjecting the glass sheet 110 to an etching process 100a, can remove an amount of material (e.g., glass) from the glass sheet 110 while maintaining acceptable quality thickness variability and uniformity, including a post-etch thickness variability of the final predetermined thickness 115 of the glass sheet 110 that can be less than, the same as, or greater than and within an acceptable range of a pre-etch thickness variability of the initial thickness 113 of the glass sheet 110.

The glass etcher 100 can include any one or more of a load station 101, an etch chamber 102 including an etching zone 102a, an isolation region 103, a wash chamber 104 for washing 104a the glass sheet 110, a dry chamber 105, and an unload station 106 arranged in series in the glass etcher 100. While the glass etcher 100 is depicted as having a predetermined number of stations, chambers, and regions (e.g., load station 101, etch chamber 102, isolation region 103, wash chamber 104, dry chamber 105, and unload station 106), this should not limit the scope of the claims appended herewith as any number of stations, chambers, and regions (e.g., load station 101, etch chamber 102, isolation region 103, wash chamber 104, dry chamber 105, and unload station 106) can be provided in a single glass etcher 100 to reduce a thickness 114 of the glass sheet 110 to obtain a final predetermined thickness 115 of the glass sheet 110. For example, a single glass etcher 100 can include alone or in combination a plurality of a load station 101, an etch chamber 102 including an etching zone 102a, an isolation region 103, a wash chamber 104 for washing 104a the glass sheet 110, a dry chamber 105, and an unload station 106 arranged respectively in series in the glass etcher 100.

Further, it is also envisioned that plural glass etchers 100, or portions thereof, including any one or more stations, chambers, and regions (e.g., load station 101, etch chamber 102, isolation region 103, wash chamber 104, dry chamber 105, and unload station 106) can be arranged in proximity to each other and/or connected to each other to carry out the processing of the glass sheet 110 as disclosed herein to reduce a thickness 114 of the glass sheet 110 to obtain a final predetermined thickness 115 of the glass sheet 110. Thus, in some embodiments, the etching zone 102a can include a plurality of etching zones, and the glass sheet 110 can be passed through each of the plurality of etching zones at least once. In some embodiments, passing the glass sheet 110 through each of the plurality of etching zones at least once can correspond to passing the glass sheet 110 through the etching zone 102a a plurality of times. The glass sheet 110 can then be washed 104a after each pass through each of the plurality of etching zones.

Accordingly, in some embodiments, the glass sheet 110 can be subjected to an etching process 100a in a first glass etcher including any one or more of a load station 101, an etch chamber 102 including an etching zone 102a, an isolation region 103, a wash chamber 104 for washing 104a the glass sheet 110, a dry chamber 105, and an unload station 106. The glass sheet 110 can then be subjected to another etching process (e.g., an etching process that is the same as or similar to etching process 100a) in a second glass etcher including any one or more of a load station 101, an etch chamber 102 including an etching zone 102a, an isolation region 103, a wash chamber 104 for washing 104a the glass sheet 110, a dry chamber 105, and an unload station 106. For example, the glass sheet 110 can be passed through a first etch zone in a first glass etcher, then washed in a first wash zone in the first glass etcher, then passed through a second etch zone in a second glass etcher and then washed in a second wash zone in the second glass etcher. Any number of additional glass etchers can be provided in further embodiments, with the understanding that the first glass etcher, the second glass etcher, and any additional glass etchers can include the same or similar features, including any one or more features of the exemplary glass etcher 100 disclosed herein. Such an embodiment can be understood to correspond to a setup including more than one glass etcher 100, or portions thereof, as shown in FIG. 1, arranged, for example in series, such that the glass sheet 110 can be passed through a plurality of etching zones and washed after each pass through each of the plurality of etching zones. Moreover, in some embodiments, the glass sheet 110 can be subjected to the etching process 100a in any one or more of the plurality of glass etchers one or more times, without departing from the scope of the claims appended hereto.

The glass etcher 100 can also include a conveyor 108 defining a conveyance path 108a that can extend along a horizontal direction 109 of the glass etcher 100 from the load station 101 (where the glass sheet 110 can be loaded into the glass etcher 100) to the unload station 106 (where the glass sheet 110 can be unloaded and removed from the glass etcher 100). The conveyor 108 can move the glass sheet 110 through one or more of the etch chamber 102, the isolation region 103, the wash chamber 104, and the dry chamber 105, to carry out processing of the glass sheet 110. The conveyor 108 can include belts, rollers, and wheels arranged above and below the glass sheet 110 to move (e.g., convey, carry, transfer) the glass sheet 110 horizontally along the conveyance path 108a through the glass etcher 100 in the horizontal direction 109, thus subjecting the glass sheet 110 to one or more stages of the etching process 100a. In some embodiments, the conveyor 108 can contact the first major surface 111 and the second major surface 112 of the glass sheet 110 to move the glass sheet 110 along the conveyance path 108a through the glass etcher 100. In other embodiments, a plurality of glass etchers can be arranged along the conveyance path 108a (e.g., in series), and the conveyor 108 can move the glass sheet 110 along the conveyance path 108a through the plurality of glass etchers.

In further embodiments, the conveyor 108 can move the glass sheet 110 along the conveyance path 108a through the glass etcher 100 in a forward direction (e.g., horizontal direction 109) along the conveyance path 108a, a backward direction opposite the forward direction along the conveyance path 108a, and any combination of a forward direction along the conveyance path 108a and a backward direction along the conveyance path 108a. For example, the conveyor 108 can move the glass sheet 110 through the glass etcher 100 in a forward direction along the conveyance path 108a such that the glass sheet 110 is successively passed through, for example, the etch chamber 102 including an etching zone 102a and then the wash chamber 104 for washing 104a the glass sheet 110. After the glass sheet 110 is washed in the wash chamber 104, the conveyor 108 can then, for example, be reversed to move the glass sheet 110 back through the glass etcher 100 in a backward direction opposite the forward direction along the conveyance path 108a such that the glass sheet 110 can again be passed through, for example, the etch chamber 102 including the etching zone 102a in the opposite direction. In some embodiments, a wash chamber (e.g., wash chamber 104) can be provided on either side of the etch chamber 102 along the conveyance path 108a. For example, an additional wash chamber (not shown) can be provided on an opposite side of the etch chamber 102 from the wash chamber 104 such that when the glass sheet 110 is moved by the conveyor 108 in the backward direction through the etch chamber 102, the glass sheet 110 can then be subsequently washed in the additional wash chamber. The additional wash chamber can include any one or more features that are the same as or similar to the features of wash chamber 104 for washing 104a the glass sheet 110. Moreover, the conveyor 108 can repeat the forward and backward movement of the glass sheet 110 to successively pass the glass sheet 110 through the etch chamber 102 including the etching zone 102a, the wash chamber 104, and the additional wash chamber one or more times to reduce a thickness 114 of the glass sheet 110 and to obtain a final predetermined thickness 115 of the glass sheet 110.

The load station 101 can include a frame supporting the conveyor 108 on which the glass sheet 110 can be conveyed and an opening through which the glass sheet 110 can travel into the etch chamber 102. The load station 101 can also include one or more sensors to determine a presence or an absence of the glass sheet 110 in the load station 101 to, for example, control an on/off operation of one or more features and operations of the glass etcher 100 and the etching process 100a. In other embodiments, a thickness sensor can be provided to determine a thickness 114 of the glass sheet 110. In some embodiments, the thickness sensor can detect whether the final predetermined thickness 115 of the glass sheet 110 has be achieved, and the thickness sensor can then provide a signal to the glass etcher 100 to stop operation such that the glass sheet 110 having the final predetermined thickness 115 can be removed from the glass etcher 100. Conversely, in some embodiments, if the thickness sensor detects that the final predetermined thickness 115 of the glass sheet 110 has not yet been achieved, the thickness sensor can provide a signal to the glass etcher 100 to start or to continue operation to reduce a thickness 114 of a glass sheet 110 by subjecting the glass sheet 110 to the etching process 100a.

The etch chamber 102 including the etching zone 102a can include a lid, a splash cover, an exhaust vent to vent fumes, a drain to drain liquid, a sump to collect liquid, a pump to pump liquid, heating and cooling coils or tubes to control a temperature of the etch chamber 102, spray tubes, spray nozzles, valves to control or adjust a pressure of spray, a spray pump, pressure gauges, a solution filtration system (e.g., mesh, screen, filter) for the spray pump, sensors to determine a temperature or fluid level, and one or more motors or actuators to, for example, oscillate the spray tubes and spray nozzles or to power the conveyor 108. The etchant can be any corrosive chemical including an acid having various concentrations. For example, the etchant can include hydrofluoric acid (HF) or any other corrosive chemical, a stabilizer, and water. The stabilizer can include nitric acid (HNO3), sulfuric acid (H2SO4), hydrochloric acid (HCl), or any other suitable stabilizer.

Figure 2:
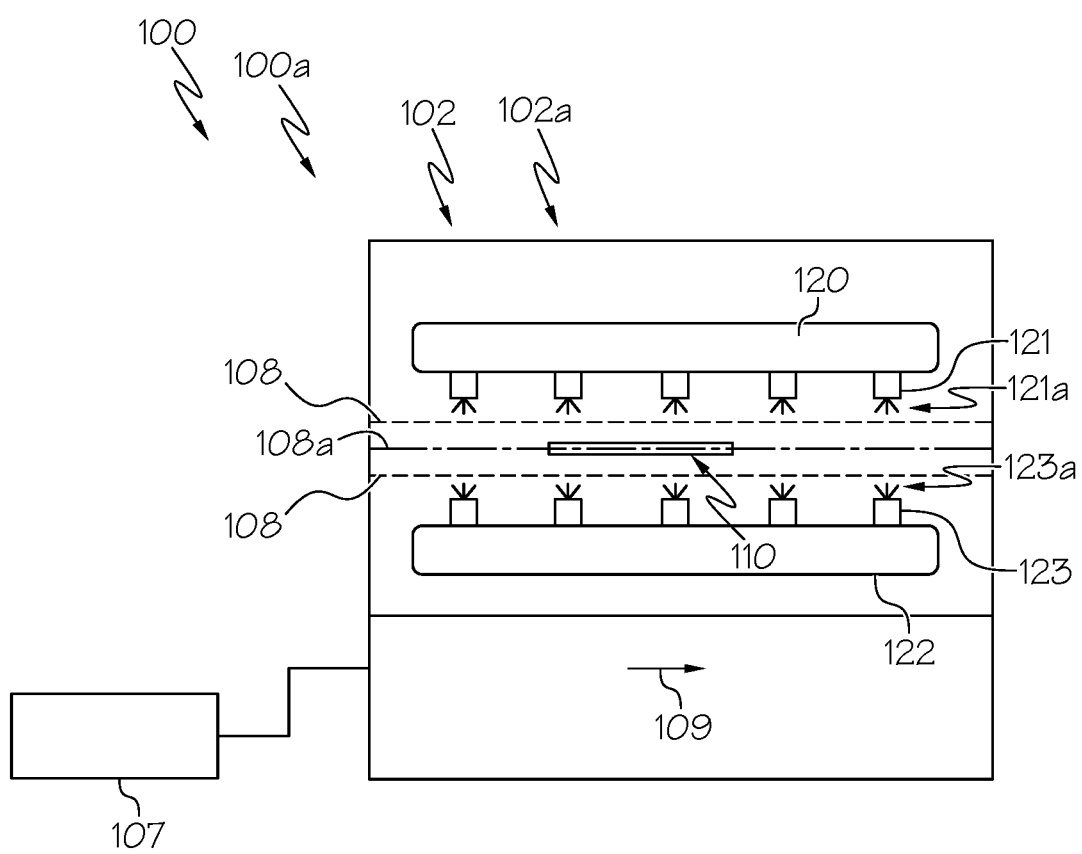
FIG. 2 shows a schematic illustration of a cutaway side view of an exemplary etch chamber in accordance with embodiments described herein.

Turning to FIG. 2, a cutaway side view of the etch chamber 102 including the etching zone 102a of the glass etcher 100 is schematically illustrated. As shown, the conveyor 108 can extend through the etch chamber 102 to convey the glass sheet 110 in the horizontal direction 109 along the conveyance path 108a through the etching zone 102a. In addition, one or more top sprayers 120 including corresponding top spray nozzles 121 can be provided above the conveyance path 108a. The one or more top sprayers 120 including the one or more top spray nozzles 121 can spray a first etchant 121a onto the glass sheet 110 to remove a layer of material from the glass sheet 110 and reduce a thickness 114 of the glass sheet 110. Likewise, one or more bottom sprayers 122 including corresponding bottom spray nozzles 123 can be provided below the conveyance path 108a. The one or more bottom sprayers 122 including the one or more bottom spray nozzles 123 can spray a second etchant 123a onto the glass sheet 110 to remove a layer of material from the glass sheet 110 and reduce a thickness 114 of the glass sheet 110. For example, the one or more top sprayers 120 including the top spray nozzles 121 can spray the first etchant 121a on the first major surface 111 of the glass sheet 110 when the glass sheet 110 is conveyed through the etching zone 102a with the first major surface 111 of the glass sheet 110 facing the one or more top sprayers 120 and corresponding top spray nozzles 121. Thus, the top spray nozzles 121 can be oriented to direct the spray of the first etchant 121a in a direction of the first major surface 111 of the glass sheet 110 to primarily initially impinge upon the first major surface 111 of the glass sheet 110. Similarly, the one or more bottom sprayers 122 including the bottom spray nozzles 123 can spray the second etchant 123a on the second major surface 112 of the glass sheet 110 when the glass sheet 110 is conveyed through the etching zone 102a with the second major surface 112 of the glass sheet 110 facing the one or more bottom sprayers 122 and corresponding bottom spray nozzles 123. Thus, the bottom spray nozzles 123 can be oriented to direct the spray of the second etchant 123a in a direction of the second major surface 112 of the glass sheet 110 to primarily initially impinge upon the second major surface 112 of the glass sheet 110.

Advantageously, flipping the glass sheet 110 between successive passes of the glass sheet 110 through the etching zone 102a, between successive forward/back passes of the glass sheet 110 through the etching zone 102a, and/or between successive passes of the glass sheet 110 through a plurality of etching zones can compensate for any variation in application of the etchant onto the glass sheet 110. For example, despite best efforts, the one or more top sprayers 120, top spray nozzles 121, bottom sprayers 122, and bottom spray nozzles 123 may distribute the corresponding first etchant 121a and second etchant 123a in a non-uniform pattern onto the glass sheet 110 resulting in non-uniform reduction in thickness 114 of the glass sheet 110. Such non-uniform distribution of the etchant can be based at least in part on spray pressures, differences among spray nozzles, accuracy of rotation speed and oscillation of the sprayers, as well as any other process characteristics and variables that can be encountered during the etching process 100a. Moreover, based at least on the effect of gravity acting on the horizontal etching process 100a, first etchant 121a applied to an upward facing major surface of the glass sheet 110 as well as first etchant byproduct (e.g., sludge) may have a tendency to pool, puddle, and remain on the upward facing major surface of the glass sheet 110; whereas, second etchant 123a applied to a downward facing major surface of the glass sheet 110 as well as second etchant byproduct (e.g., sludge) may have a tendency to fall off and drip from the downward facing major surface of the glass sheet 110.

Accordingly, regarding each pass of the glass sheet 110 through the etching zone 102a or through a plurality of etching zones, a duration during which the first etchant 121a and the first etchant byproduct are exposed to the corresponding upward facing major surface of the glass sheet 110 can be longer than the duration during which the second etchant 123a and the second etchant byproduct are exposed to the corresponding downward facing major surface of the glass sheet 110. Differences in duration of exposure of the glass sheet 110 to the etchant can result in differences in reduction of the thickness 114 of the glass sheet 110. Similarly, because the first etchant 121a and the first etchant byproduct may have a tendency to pool, puddle, and remain on the upward facing major surface of the glass sheet 110, fresh first etchant 121a may be prevented from contacting the upward facing major surface of the glass sheet 110 in the areas where the first etchant 121a and the first etchant byproduct have pooled, puddled, and remained on the upward facing major surface of the glass sheet 110. Conversely, because the second etchant 123a and the second etchant byproduct may have a tendency fall off and drip from the downward facing major surface of the glass sheet 110, fresh second etchant 123a may contact the downward facing major surface of the glass sheet 110 in the areas where the second etchant 123a and the second etchant byproduct have fallen off or dripped from the downward facing major surface of the glass sheet 110. Differences in exposure of the glass sheet 110 to fresh etchant can result in differences in reduction of the thickness 114 of the glass sheet 110. Thus, flipping the glass sheet 110 between successive passes of the glass sheet 110 through the etching zone 102a between successive forward/back passes of the glass sheet 110 through the etching zone 102a, and/or between successive passes of the glass sheet 110 through a plurality of etching zones can expose equally the major surfaces 111, 112 of the glass sheet 110 to the process characteristics and variables, minimizing variation in application of the etchant onto the major surfaces 111, 112 of the glass sheet 110 and therefore improving the etching process 100a including the optical clarity and the thickness variability of the glass sheet 110.

In addition, varying the amount (e.g., flow rate) of the first etchant 121a and the second etchant 123a onto the glass sheet 110 can minimize variation in application of the etchant onto the glass sheet 110, therefore improving the etching process 100a including the optical clarity and the thickness variability of the glass sheet 110. For example, in another embodiment, to at least in part compensate for the first etchant 121a pooling, puddling, and remaining on the upward facing major surface of the glass sheet 110 and the second etchant 123a falling off and dripping from the downward facing major surface of the glass sheet 110, a first flow rate of the first etchant 121a from the one or more top sprayers 120 can be less than a second flow rate of the second etchant 123a from the one or more bottom sprayers 122. Adjusting the flow rate of the first etchant 121a to be less than the flow rate of the second etchant 123a can account for the differences in duration of time during which the corresponding upward facing major surface of the glass sheet 110 and the downward facing major surface of the glass sheet 110 are exposed to etchant, minimizing any variation in application of the etchant onto the glass sheet 110 and therefore improving the etching process 100a including the optical clarity and the thickness variability of the glass sheet 110.

Figure 3:
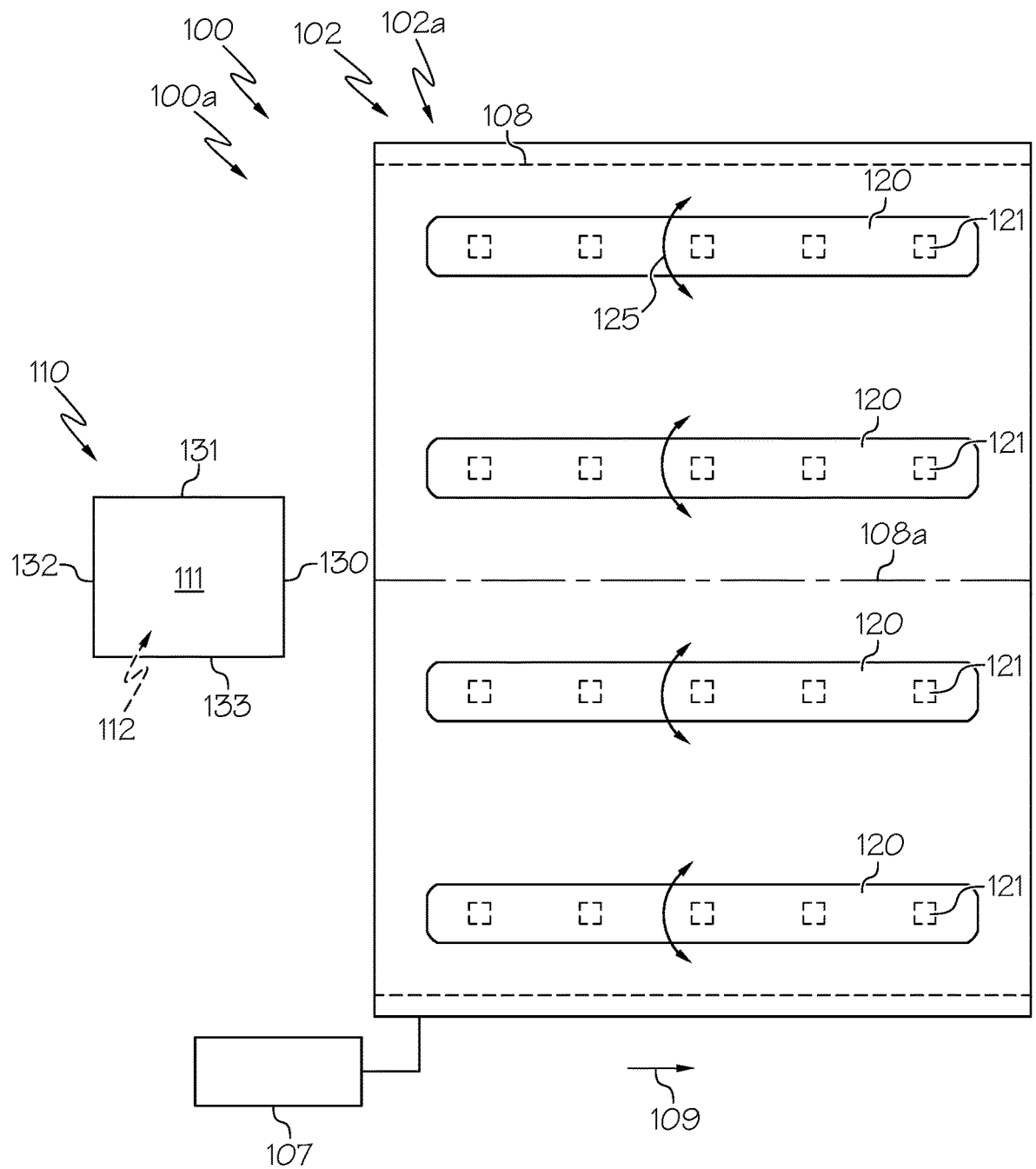
FIG. 3 shows a cutaway top view of the exemplary etch chamber of FIG. 2 in accordance with embodiments described herein.

In addition, as shown in FIG. 3 which illustrates a cutaway top view of the etch chamber 102, the glass sheet 110 can include the first major surface 111, the second major surface 112, a first side 130, a second side 132 opposite the first side 130, a third side 131 adjacent to the first side 130, and a fourth side 133 opposite the third side 131. During a first pass of the glass sheet 110 through the etching zone 102a, the glass sheet 110 can be provided to the glass etcher 100 as shown such that the first major surface 111 faces the one or more top sprayers 120 and corresponding top spray nozzles 121 to be exposed to the first etchant 121a, and such that the second major surface 112 faces the one or more bottom sprayers 122 and corresponding bottom spray nozzles 123 (shown in FIG. 2 and hidden from view in FIG. 3) to be exposed to the second etchant 123a. Following the first pass of the glass sheet 110 through the etching zone 102a and prior to a second subsequent pass of the glass sheet 110 through the etching zone 102a, the glass sheet 110 can be flipped (e.g., rotated 180 degrees about an axis parallel to a major surface of the glass sheet 110), either manually or by a robot, and can then be provided to the glass etcher 100 such that the first major surface 111 faces the one or more bottom sprayers 122 and corresponding bottom spray nozzles 123 (shown in FIG. 2 and hidden from view in FIG. 3) to be exposed to the second etchant 123a, and such that the second major surface 112 faces the one or more top sprayers 120 and corresponding top spray nozzles 121 to be exposed to the first etchant 121a. In any one or more subsequent passes of the glass sheet 110 through the etching zone 102a, the glass sheet 110 can again be flipped (e.g., rotated 180 degrees about an axis parallel to a major surface of the glass sheet 110) such that first major surface 111 of the glass sheet 110 and the second major surface 112 of the glass sheet 110 are exposed (e.g., alternatingly exposed) to the first etchant 121a and the second etchant 123a, respectively, during successive passes of the glass sheet 110 through the etching zone 102a.

In other embodiments, the glass sheet 110 can be reoriented (e.g., rotated 180 degrees about an axis perpendicular to a major surface of the glass sheet 110) any one or more times during the etching process 100a between successive passes of the glass sheet 110 through the etching zone 102a between successive forward/back passes of the glass sheet 110 through the etching zone 102a, and/or between successive passes of the glass sheet 110 through a plurality of etching zones to expose a different region of the major surfaces (e.g., first major surface 111, second major surface 112) of the glass sheet 110 to different spray bars and spray nozzles than the spray bars and spray nozzles to which the different region of the major surfaces was exposed during a prior pass (e.g., immediately prior pass) of the glass sheet 110 through the etching zone 102a. For example, regarding the horizontal direction 109 of the glass sheet 110 through the etching zone 102a along the conveyance path 108a, during a first pass of the glass sheet 110 through the etching zone 102a, the first major surface 111 of the glass sheet 110 can be exposed to the first etchant 121a from the one or more top sprayers 120 and the second major surface 112 of the glass sheet 110 can be exposed to the second etchant 123a from the one or more bottom sprayers 122. During this first pass, the first side 130 of the glass sheet 110 can be a leading edge through the etching zone 102a and the second side 132 of the glass sheet 110 can be a trailing edge through the etching zone 102a. During a second pass, the first major surface 111 of the glass sheet 110 can again be exposed to the first etchant 121a from the one or more top sprayers 120 and the second major surface 112 of the glass sheet 110 can be exposed to the second etchant 123a from the one or more bottom sprayers 122, however the glass sheet 110 can be reoriented (e.g., rotated 180 degrees about an axis perpendicular to a major surface of the glass sheet 110) such that the second side 132 of the glass sheet 110 can be a leading edge and the first side 130 of the glass sheet 110 can be a trailing edge through the etching zone 102a during the second pass.

In other embodiments, the glass sheet 110 can be reoriented at any angle (e.g., rotated 15 degrees, 30 degrees, 45 degrees, 90 degrees, etc.) about an axis perpendicular to a major surface of the glass sheet 110 any one more times during the etching process 100a between successive passes of the glass sheet 110 through the etching zone 102a to expose a different region of the major surfaces (e.g., first major surface 111, second major surface 112) of the glass sheet 110 to different spray bars and spray nozzles than the spray bars and spray nozzles to which the different region of the major surfaces was exposed during a prior pass (e.g., immediately prior pass) of the glass sheet 110 through the etching zone 102a.

Advantageously, at least one of flipping and reorienting the glass sheet 110 between successive passes of the glass sheet 110 through the etching zone 102a between successive forward/back passes of the glass sheet 110 through the etching zone 102a, and/or between successive passes of the glass sheet 110 through a plurality of etching zones can compensate for variation in application of the etchant onto the glass sheet 110. For example, despite best efforts, the one or more top sprayers 120, top spray nozzles 121, bottom sprayers 122, and bottom spray nozzles 123 may distribute the corresponding first etchant 121a and second etchant 123a in a non-uniform pattern onto the glass sheet 110 resulting in non-uniform reduction in thickness 114 of the glass sheet 110. Such non-uniform distribution of the etchant can be based at least in part on spray pressures, differences among spray nozzles, accuracy of rotation speed and oscillation of the sprayers, as well as any other process characteristics and variables that can be encountered during the etching process 100a. Thus, at least one of flipping and reorienting the glass sheet 110 between successive passes of the glass sheet 110 through the etching zone 102a, between successive forward/back passes of the glass sheet 110 through the etching zone 102a, and/or between successive passes of the glass sheet 110 through a plurality of etching zones can expose equally the major surfaces 111, 112 of the glass sheet 110 to the process characteristics and variables, minimizing variation in application of the etchant onto the glass sheet 110 and therefore improving the etching process 100*a* including the optical clarity and the thickness variability of the glass sheet 110.

Such a multi-pass etching process 100*a* can be repeated a plurality of times, reducing a thickness 114 of the glass sheet 110 during each pass, until a final predetermined thickness 115 of the glass sheet 110 can be obtained. It is to be understood that any combination of flipping and/or reorienting of the glass sheet 110 (e.g., rotating 180 degrees about an axis parallel to a major surface of the glass sheet 110; rotating 180 degrees, 90 degrees, etc. about an axis perpendicular to a major surface of the glass sheet 110; rotating 180 degrees about an axis parallel to a major surface of the glass sheet 110, and rotating 180 degrees, 90 degrees, etc. about an axis perpendicular to a major surface of the glass sheet 110, etc.) can be performed in any order between successive passes of the glass sheet 110 through the etching zone 102*a*, between successive forward/back passes of the glass sheet 110 through the etching zone 102*a*, and/or between successive passes of the glass sheet 110 through a plurality of etching zones to expose the first major surface 111 (as well as one or more regions of the first major surface 111) of the glass sheet 110 and the second major surface 112 (as well as one or more regions of the second major surface 112) of the glass sheet 110 to any or all combinations of spray of first etchant 121*a* from any one or more of the top sprayers 120 and corresponding top spray nozzles 121 as well as spray of second etchant 123*a* from any one or more of the bottom sprayers 122 and corresponding bottom spray nozzles 123.

In some embodiments, the etch chamber 102 can include any number of sprayers (e.g. top sprayers 120, bottom sprayers 122) as well as any number of corresponding top spray nozzles 121 and bottom spray nozzles 123. The spray nozzles (e.g. at least one of the top spray nozzles 121 and the bottom spray nozzles 123) can be conical nozzles having a spray angles within a range of from about 45 degrees to about 90 degrees, although other spray angles may be provided in further embodiments. In addition, to control process parameters, one or more spray nozzles and/or one or more sprayers may be plugged or otherwise deactivated to prevent a spraying operation of the etchant from the spray nozzles and sprayers. In one embodiment, four top sprayers 120 can be provided and all but one can be plugged. The one top sprayer 120 can include four 45 degree 0.5 gallons per minute (gpm) conical nozzles. In another embodiment, four bottom sprayers 122 can be provided. Three of the bottom sprayers 122 can include four 90 degree 0.75 gpm conical nozzles and one of the bottom sprayers 122 can include six 90 degree 0.75 gpm conical nozzles. The bottom sprayer 122 with six nozzles can align vertically with the one top sprayer 120. Other configurations of sprayers and spray nozzles are contemplated and are considered to be within the scope of the disclosure.

The isolation region 103 can rinse or remove residual etchant (e.g., first etchant 121*a*, second etchant 123*a*) from the glass sheet 110 prior to the glass sheet 110 entering the wash chamber 104, where the glass sheet 110 can be subjected to washing 104*a*. The isolation region 103 can include nozzles to rinse the glass sheet 110 and a drain to drain rinse liquid and etchant out of the glass etcher 100.

The wash chamber 104 can include spray tubes, spray nozzles, pumps, water feeds, and flow control valves to accomplish the washing 104*a* of the glass sheet 110. The spray nozzles can spray a fluid onto the glass sheet 110 to wash etchant and etchant byproducts (e.g., sludge) from the glass sheet 110. In some embodiments, the fluid can include water and/or a cleaning agent (e.g., detergent). By washing the etchant and the etchant byproducts from the glass sheet 110, the reduction of the thickness 114 of the glass sheet 110 can be terminated either temporarily (e.g., if subsequent passes of the glass sheet 110 through the etching zone 102*a* are desired), or permanently (e.g., if a final predetermined thickness 115 of the glass sheet 110 has been obtained). Washing 104*a* the glass sheet 110 in the wash chamber 104 prior to each subsequent pass of the glass sheet 110 through the etching zone 102*a* can improve the quality and uniformity of the etching process 100*a* by ensuring that the first major surface 111 of the glass sheet 110 and the second major surface 112 of the glass sheet 110 are clean of residual etchant and etchant byproduct prior to each successive pass of the glass sheet 110 through the etching zone 102*a*.

Accordingly, by washing 104*a* the glass sheet 110 frequently and prior to each subsequent pass of the glass sheet 110 through the etching zone 102*a*, fresh etchant can uniformly contact the glass sheet 110 during each successive pass of the glass sheet 110 through the etching zone 102*a*. Advantageously, the thickness variability of the glass sheet 110 subjected to the etching process 100*a* of the present disclosure can be reduced as compared to other etching processes (e.g., vertical bath) where etchant and etchant byproduct (e.g., sludge) can remain on the glass sheet 110 for a longer duration of time, preventing fresh etchant from contacting the glass sheet 110 and permitting uneven and non-uniform reduction in thickness 114 of the glass sheet 110.

The dry chamber 105 can include fans, blowers, and turbines to blow a gas onto the glass sheet 110 to remove liquid, including rinse liquid, wash liquid, and residual etchant from the glass sheet 110. The unload station 106 can include a frame supporting the conveyor 108 on which the glass sheet 110 can be conveyed an opening through which the glass sheet 110 can travel out of the dry chamber 105. The unload station 106 can also include one or more sensors to determine a presence or an absence of the glass sheet 110 in the unload station 106 to, for example, control an on/off operation of one or more features and operations of the glass etcher 100 and the etching process 100*a*.

In addition, the glass etcher 100 can include a controller 107 to control one or more operations of the glass etcher 100 and the etching process 100*a*, including any one or more operations of the load station 101, the etch chamber 102 and the etching zone 102*a*, the isolation region 103, the wash chamber 104 and the washing 104*a*, the dry chamber 105, the unload station 106, and the conveyor 108. For example, the controller 107 can include any one or more of a microcontroller, programmable logic controller (PLC), discrete controller, circuit, computer, or other mechanical or electronic control feature including an active or passive user interface by which a robot or human user can select, adjust, start, stop, or otherwise control the any one or more operations of the glass etcher 100 and the etching process 100*a*. In further embodiments, the glass etcher 100 may be partially or entirely manually operated with or without a controller.

Embodiments of the subject matter and the functional operations described herein can be implemented in any one or more, including any combinations of one or more, of digital electronic circuitry, computer software, firmware, hardware, including the structures disclosed in this specification and structural equivalents thereof. Embodiments of the subject matter described herein can be implemented as one or more computer program products, (e.g., one or more modules of computer program instructions encoded on a tangible program carrier for execution by, or to control the operation of, data processing apparatus). The tangible program carrier can be a computer readable medium. The computer readable medium can be any one or more, including any combinations of one or more, of a machine-readable storage device, a machine readable storage substrate, and a memory device.

The term "processor" or "controller" can encompass all apparatus, devices, and machines for processing data, including by way of exemplary embodiments a programmable processor, a computer, or multiple processors or computers. The processor can include, in addition to hardware, code that creates an execution environment for the computer program in question, (e.g., code that includes any one or more, including any combinations of one or more, of processor firmware, a protocol stack, a database management system, and an operating system).

A computer program (also known as a program, software, software application, script, or code) can be written in any form of programming language, including compiled or interpreted languages, or declarative or procedural languages, and can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform functions by operating on input data and generating output. The processes and logic flows can also be performed by, and apparatus can also be implemented as, special purpose logic circuitry, (e.g., an FPGA (field programmable gate array) or an ASIC (application specific integrated circuit)).

Processors suitable for the execution of a computer program include, by way of exemplary embodiments, both general and special purpose microprocessors, and any one or more processors of any kind of digital computer. Generally, a processor will receive instructions and data from a read only memory, a random access memory, or both. The essential elements of a computer include a processor for performing instructions and one or more data memory devices for storing instructions and data. Generally, a computer will also include, or be operatively coupled to receive data from or transfer data to, or both, one or more mass storage devices for storing data, (e.g., magnetic, magneto optical disks, or optical disks). However, a computer need not have such devices.

Computer readable media suitable for storing computer program instructions and data include all forms of data memory including nonvolatile memory, media and memory devices, including by way of exemplary embodiments semiconductor memory devices, (e.g., EPROM, EEPROM, and flash memory devices); magnetic disks, (e.g., internal hard disks or removable disks); magneto optical disks; and CD ROM and DVD-ROM disks. The processor and the memory can be supplemented by, or incorporated in, special purpose logic circuitry.

To provide for interaction with a user, embodiments of the subject matter described herein can be implemented on a computer having a display device, (e.g., a LCD (liquid crystal display) monitor), for displaying information to the user and a keyboard and a pointing device, (e.g., a mouse or a trackball), by which the user can provide input to the computer. Other kinds of devices can be used to provide for interaction with a user as well; for example, input from the user can be received in any form, including acoustic, speech, or tactile input.

Embodiments of the subject matter described herein can be implemented in a computing system that includes a back end component, (e.g., a data server), or that includes a middleware component, (e.g., an application server), or that includes a front end component, (e.g., a client computer) having a graphical user interface or a Web browser through which a user can interact with an implementation of the subject matter described herein, or any combination of one or more of such back end, middleware, or front end components. The components of the system can be interconnected by any form or medium of digital data communication, including a communication network. Embodiments of communication networks include a local area network ("LAN") and a wide area network ("WAN"), including the Internet. The computing system can include clients and servers. A client and server can generally be remote from each other and may typically interact through a communication network. The relationship of client and server can arise by virtue of computer programs running on the respective computers and having a client-server relationship to each other.

In some embodiments, the glass etcher 100 can be constructed from at least one of metal and plastic, including at least one of titanium, PVC, and fiberglass. The glass etcher 100 can include additional features, including but not limited to on/off switches, analog read-outs, digital read-outs, control potentiometers, status lights, indicator lights, interlock lights, and other indication knobs, switches, sensors, and signals. Moreover, as compared to, for example, a submersion etch process and mechanical polish process that can be used to thin a glass sheet 110, the etching process 100*a* disclosed herein can thin glass sheets on a continuous relatively faster basis, thus saving time, reducing costs, and increasing throughput and output. It is to be understood that the foregoing features of the glass etcher 100 are exemplary features and are not intended to limit the scope of the disclosure. Thus, other features and configurations of the glass etcher 100 are contemplated herein and can include any same, similar, or different features including features already described as well as features not explicitly provided herein.

Accordingly, it is to be understood that the features and configurations of the glass etcher 100 can be selected, controlled, adjusted, altered, and modified based at least in part on a size of the glass sheet 110 or any other parameter, including a desired dimensional characteristic, optical clarity, or other feature of the glass sheet 110 that may at least in part dictate the selection, control, adjustment, alteration, and modification of any one or more features and configurations of the glass etcher 100. Thus, other glass etchers, including glass etchers not explicitly described herein, can also be provided in other embodiments for performing an etching process 100*a*. Further, any features of the glass etcher 100 disclosed herein, including features not explicitly described herein, can be modified, altered, and adjusted prior to, during, and after the etching process 100*a* to include one or more different features and configurations for processing glass in accordance with the etching process 100a without departing from the scope of the disclosure.

A method of reducing a thickness 114 of a glass sheet 110 by subjecting the glass sheet 110 to an etching process 100a can include the steps of passing the glass sheet 110 through the etching zone 102a along the conveyance path 108a a plurality of times until the initial thickness 113 of the glass sheet 110 can be reduced to the final predetermined thickness 115 of the glass sheet 110, and washing 104a the glass sheet 110 after each pass through the etching zone 102a.

The method can further include the steps of exposing the first major surface 111 of the glass sheet 110 to the first etchant 121a and exposing the second major surface 112 of the glass sheet 110 to the second etchant 123a during a first pass of the glass sheet 110 through the etching zone 102a, and then exposing the first major surface 111 of the glass sheet 110 to the second etchant 123a and exposing the second major surface 112 of the glass sheet 110 to the first etchant 121a during a subsequent pass of the glass sheet 110 through the etching zone 102a. In one embodiment, the first etchant 121a can be provided to the glass sheet 110 from the one or more top sprayers 120 arranged above the conveyance path 108a, and the second etchant 123a can be provided to the glass sheet 110 from the one or more bottom sprayers 122 arranged below the conveyance path 108a. In another embodiment, a first flow rate of the first etchant 121a from the top sprayers 120 can be less than a second flow rate of the second etchant 123a from the bottom sprayers 122.

In one embodiment, the method can further include the step of flipping the glass sheet 110 by rotating the glass sheet 110 180 degrees about an axis parallel to a major surface (e.g., first major surface 111, second major surface 112) of the glass sheet 110 between two consecutive passes through the etching zone 102a, between successive forward/back passes of the glass sheet 110 through the etching zone 102a, and/or between successive passes of the glass sheet 110 through a plurality of etching zones. In another embodiment, the method can further include the step of reorienting the glass sheet 110 by rotating the glass sheet 110 180 degrees, 90 degrees, etc. about an axis perpendicular to a major surface (e.g., first major surface 111, second major surface 112) of the glass sheet 110 prior to a subsequent pass through the etching zone 102a, prior to a subsequent forward/back pass of the glass sheet 110 through the etching zone 102a, and/or prior to a subsequent pass of the glass sheet 110 through a plurality of etching zones.

In yet another embodiment, the method can further include the step of reorienting the glass sheet 110 by rotating the glass sheet 110 180 degrees about an axis perpendicular to a major surface (e.g., first major surface 111, second major surface 112) of the glass sheet 110 between two consecutive passes through the etching zone 102a, between successive forward/back passes of the glass sheet 110 through the etching zone 102a, and/or between successive passes of the glass sheet 110 through a plurality of etching zones. In still another embodiment, the method can further include the step of at least one of flipping the glass sheet 110 by rotating the glass sheet 110 at least one of 180 degrees about an axis parallel to a major surface (e.g., first major surface 111, second major surface 112) of the glass sheet 110 and reorienting the glass sheet 110 by rotating the glass sheet 110 180 degrees about an axis perpendicular to a major surface (e.g., first major surface 111, second major surface 112) of the glass sheet 110 between each consecutive pass through the etching zone 102a, between successive forward/back passes of the glass sheet 110 through the etching zone 102a, and/or between successive passes of the glass sheet 110 through a plurality of etching zones.

In one embodiment, the glass sheet 110 including the final predetermined thickness 115 can include a DOI that can be greater than or equal to about 98.5. In another embodiment, the DOI can be obtained without subjecting the glass sheet 110 to a mechanical polishing process. For purposes of this application, a mechanical polishing process means a process that mechanically engages a surface of a glass sheet with a solid object (e.g., abrasive surface of a tool, an abrasive powder) to work the surface of the glass sheet to reduce the thickness of the glass sheet or increase the surface smoothness of the glass sheet.

A representative sample of data obtained from an exemplary etching process 100a in accordance with the embodiments disclosed herein is shown in TABLE 1. The data in TABLE 1 was obtained at process temperatures of 90 degrees Fahrenheit, a spray oscillation along direction 125 of the one or more top sprayers 120 and the one or more bottom sprayers 122 of 25 cycles/minute, with a dwell time in the etching zone 102a of four minutes. Fusion drawn glass sheets with the indicated initial thickness 113 were thinned to 75 microns over multiple passes (e.g., Number of Passes) through the etching zone 102a with different etchant concentrations (e.g., % HF, % HNO3) provided from both the one or more top sprayers 120 and the one or more bottom sprayers 122. As shown by the data in row 1 of TABLE 1, a DOI value greater than or equal to about 98.5 was obtained when thinning a glass sheet with an initial thickness of 400 microns to 75 microns over 15 passes using an etchant with 10% HF and 5% HNO3.

It is to be understood that the data as well as the process parameters used to obtain the data of TABLE 1 are provided for exemplary purposes only and are not intended to limit the scope of the disclosure, unless otherwise noted.

TABLE 1

| Initial Glass Thickness (microns) | % HF | % HNO3 | Number of Passes | Distinctness of Image (DOI) |
| --- | --- | --- | --- | --- |
| 400 | 10 | 5 | 15 | 99.17 |
| 550 | 10 | 5 | 21 | 98.43 |
| 400 | 15 | 7.5 | 7 | 98.32 |
| 400 | 20 | 10 | 5 | 96.33 |
| 550 | 15 | 7.5 | 9 | 97.50 |
| 550 | 20 | 10 | 7 | 94.60 |

In another embodiment, there can be achieved at least one of (i) a thickness variability of the final predetermined thickness 115 of the glass sheet 110 can be from about 4 microns to about 9 microns and (ii) an absolute value of a difference between a first thickness variability of the initial thickness 113 of the glass sheet 110 and a second thickness variability of the final predetermined thickness 115 of the glass sheet 110 can be from about 0 microns to about 7 microns. In yet another embodiment, the at least one of the thickness variability and the first thickness variability and the second thickness variability can be obtained without subjecting the glass sheet 110 to a mechanical polishing process. For example, a representative sample of data obtained from an exemplary etching process 100a in accordance with the embodiments disclosed herein is shown in TABLE 2. The data in TABLE 2 was obtained when fusion drawn glass sheets of different glass composition (e.g., glass codes 2319, EAGLE XG®, available from Corning Incorporated, Corning N.Y.) having the indicated initial thickness 113 were thinned to 75 microns over multiple passes (e.g., Number of Passes) through the etching zone 102a with different etchant concentrations (e.g., % HF). As shown by the data in TABLE 2, a thickness variability of the final predetermined thickness 115 of the glass sheet 110 (e.g., Average TTV Post Etch) from about 3 microns to about 9 microns was obtained. In addition, an absolute value of a difference between (i) a first thickness variability of the initial thickness 113 of the glass sheet 110 (e.g., Average TTV Pre Etch) and (ii) a second thickness variability of the final predetermined thickness 115 of the glass sheet 110 (e.g., Average TTV Post Etch), shown as Delta TTV, from about 0 microns to about 7 microns was obtained. In some embodiments, a final thickness tolerance and a final thickness variability of the glass sheet 110 can be based at least in part on an initial thickness tolerance and an initial thickness variability of the glass sheet 110 such that, with better control (e.g., less variability) of the initial thickness 113 of the glass sheet 110, the total post-etch thickness tolerance and final thickness variability of the final predetermined thickness 115 of the glass sheet 110 can be likewise reduced.

It is to be understood that the data as well as the process parameters used to obtain the data of TABLE 2 are provided for exemplary purposes and are not intended to limit the scope of the disclosure, unless otherwise noted.

The concentration of HF can directly control the rate at which the glass sheet 110 can be etched, whereby higher concentrations of acid can result in faster (e.g., more aggressive) etch rates, while lower concentrations of acid can result in slower (e.g., less aggressive) etch rates. In some embodiments, slower etch rates can provide an etching process 100a with better control of the removal of material—resulting in less thickness variability and better optical clarity of the glass sheet 110; whereas faster etch rates can provide an etching process 100a with less control of the removal of material—resulting in more thickness variability and reduced optical clarity of the glass sheet 110. However, slower etch rates may lead to longer processing times to remove a comparable amount of material, thus decreasing process throughput and output; whereas higher etch rates may lead to shorter processing time to remove the comparable amount of material, thus increasing process throughput an output. Apparatus and methods disclosed herein provide a balance between at least one of process time and process quality and can include an etchant concentration from about 20% HF to about 10% HF. Accordingly, in some embodiments, an etchant concentration including less than 10% HF, although able to produce high quality thinned glass sheets 110, may provide an etch rate of the glass sheet 110 that can be too slow for practical applications. Similarly, in some

TABLE 2

| | Initial Glass Thickness (microns) | | | | | | | |
|---|---|---|---|---|---|---|---|---|
| | 550 | 550 | 400 | 400 | 550 | 400 | 200 | 100 |
| Glass Composition | 2319 | 2319 | 2319 | 2319 | 2319 | 2319 | EXG | EXG |
| Number of Passes | 21 | 7 | 5 | 15 | 9 | 6 | 2 | 1 |
| % HF | 10 | 20 | 20 | 10 | 15 | 15 | 20 | 20 |
| Average TTV Post Etch (microns) | 8.8 | 8.5 | 5.5 | 5.5 | 5.4 | 4.4 | 4.3 | 3.3 |
| Average TTV Pre Etch (microns) | 2 | 3 | 2.25 | 4.25 | 5 | 5.5 | 3 | 2.6 |
| Delta TTV (microns) | 6.8 | 5.5 | 3.25 | 1.25 | 0.4 | −1.1 | 1.3 | 0.7 |

In one embodiment, the method can further include the step of controlling the etching process 100a to reduce the thickness 114 of the glass sheet 110 by about 20 microns to about 40 microns per each pass of the glass sheet 110 through the etching zone 102a. In another embodiment, the method can further include the step of controlling the etching process 100a to reduce the thickness 114 of the glass sheet 110 at a rate of from about 10 microns/min to about 20 microns/min per each pass of the glass sheet 110 through the etching zone 102a.

For example, a concentration of the etchant can control, at least in part, a rate at which the glass sheet 110 can be etched, including a rate at which material can be removed from the glass sheet 110 and a rate at which the thickness 114 of the glass sheet 110 can be reduced. The composition of the glass sheet 110 can also control, at least in part, the rate at which the glass sheet 110 can be etched. In some embodiments, the etchant can include 20% HF-10% HNO3, which when applied to a particular composition of glass can achieve an etch rate of about 20 microns/min. In other embodiments, the etchant can include 15% HF-7.5% HNO3, which when applied to a particular composition of glass can achieve an etch rate of about 15 microns/min. In still other embodiments, the etchant can include 10% HF-5% HNO3, which when applied to a particular composition of glass can achieve an etch rate of about 10 microns/min. Other embodiments may use an etchant including a 2:1 ratio of HF/HNO3.

embodiments, an etchant concentration including greater than 20% HF, although able to provide an etch rate of the glass sheet 110 that can be faster, may produce glass sheets 110 of an unacceptable quality for particular applications.

Further, a temperature of the etchant and/or environment within the etching zone 102a can be controlled to control the rate at which the glass sheet 110 can be etched. For example, temperatures of the etchant as high as about 130 degrees Fahrenheit may be provided. In other embodiments, a temperature of etchant of about 90 degrees Fahrenheit or from about 80 degrees Fahrenheit to about 120 degrees Fahrenheit can be provided. A higher temperature can correspond to a higher etch rate. For example, at a fixed acid concentration, it can be observed that changing the temperature of the etchant from 90 degrees Fahrenheit to 120 degrees Fahrenheit can approximately double the rate at which the glass sheet 110 can be etched.

In addition, a speed of the conveyor 108 can also be controlled. In some embodiments, the speed of the conveyor 108 can be adjusted to be from about 1 inch per minute to about 25 inches per minute. Based at least on a known length of the etch chamber 102 and a known rate at which the glass sheet 110 can be etched, a speed of the conveyor 108 can be selected remove a target amount of material per each pass of the plurality of passes of the glass sheet 110 through the etching zone 102a. The known etch rate can be determined based at least in part, for example, on the chemical concentration of the etchant, the temperature of the etchant, and the composition of the glass sheet 110. Accordingly, a dwell time of the glass sheet 110 within the etch chamber 102 can be determined and implemented to remove the selected amount of material from the glass sheet 110 per each pass through the etching zone 102a to produce a glass sheet 110, after subjecting the glass sheet 110 to the etching process 100a a plurality of times, having the final predetermined thickness 115.

The amount of material removed, and thus the reduction in the thickness 114 of the glass sheet 110 per each pass of the glass sheet 110 through the etching zone 102a can impact the thickness variability and optical clarity of the glass sheet 110. For example, removing too much material during a single pass can produce excessive accumulation of etchant byproduct on the glass sheet 110 that results in uneven and non-uniform removal of material because of the decreased ability of fresh etchant to contact the glass sheet 110. On the other hand, removing too little material during a single pass can lead to such a high number of passes to achieve the final predetermined thickness 115 of the glass sheet 110 that the process would be too slow for practical applications. Thus, reducing the thickness 114 of the glass sheet 110 by about 20 microns to about 40 microns per each pass of the glass sheet 110 through the etching zone 102a in combination with frequent washing 104a of the glass sheet 110 after each pass of the glass sheet 110 can provide a balance between at least process time and process quality. Accordingly, in some embodiments, removing less than 20 microns from the thickness 114 of the glass sheet 110 per pass through the etching zone 102a, although able to produce high quality thinned glass sheets 110, may result in an etching process 100a that can be too slow for practical applications. Similarly, in some embodiments, removing more than 40 microns from the thickness 114 of the glass sheet 110 per pass through the etching zone 102a, although able to achieve faster processing times, may produce glass sheets 110 of an unacceptable quality for particular applications.

In further embodiments, a spray pressure of the one or more top sprayers 120 and the one or more bottom sprayers 122 can be adjusted either together or independently from about 5 pounds per square inch gauge (psig) to about 30 psig. The spray pressure can be selected to, for example, wash away etching byproducts (e.g., sludge) from the major surfaces of the glass sheet 110 to improve the uniformity of the etching process 100a, thus reducing the thickness variability of the glass sheet 110 while maintaining a high optical clarity of the glass sheet 110. In some embodiments, a low spray pressure may be selected to limit impact, force, and stress applied to and imparted on the glass sheet 110. The top spray nozzles 121 and the bottom spray nozzles 123 can be conical or fan pattern nozzles as well as any other nozzles having a particular spray angle and flow rate. In addition, the one or more top sprayers 120 and the one or more bottom sprayers 122 can rotate and oscillate (e.g., by operation of a motor) about respective axes (e.g. as illustrated in FIG. 3 with arrow 125) to provide a uniform spray of etchant onto the glass sheet 110 to achieve complete coverage over the entire first major surface 111 of the glass sheet 110 and the entire second major surface 112 of the glass sheet 110. The oscillation of the one or more top sprayers 120 and the one or more bottom sprayers 122 can also aid in the removal and washing away of etching byproducts (e.g., sludge) from the major surfaces of the glass sheet 110.

Moreover, the total material removed (e.g., the difference between the initial thickness 113 of the glass sheet 110 and the final predetermined thickness 115 of the glass sheet 110) can influence the thickness variability and optical clarity of the glass sheet 110. For example, any variation in thickness 114 of the glass sheet 110 realized during one pass of the glass sheet 110 through the etching zone 102a can have a cumulative (e.g., additive) effect on the thickness variability of the glass sheet 110 during each successive pass, such that, under certain conditions, the more total material removed from the glass sheet 110 during the etching process 100a, the greater the cumulative effect can be, resulting in a larger final thickness variability of the final predetermined thickness 115. Accordingly, the etching process 100a can be controlled based at least in part on a total amount of material to be removed from the glass sheet 110 to mitigate the cumulative effects of the etching process 100a on the thickness variability and the optical clarity of the glass sheet 110. For example, in some embodiments, where a significant amount of total material can be removed from the glass sheet 110 during the etching process 100a, the etching process 100a can be controlled, as set forth above, to improve the thickness variability and optical clarity on each pass, thus reducing the cumulative effects when the glass sheet 110 is subjected to the plurality of passes. Likewise, in some embodiments, where a lesser amount of total material can be removed from the glass sheet 110 during the etching process 100a, the etching process 100a can be controlled, as set forth above, to increase the processing speed of the etching process 100a, perhaps sacrificing thickness variability and optical clarity on each pass, but not so much as to result in unacceptable thickness variability and optical clarity when the cumulative effects, after subjecting the glass sheet 110 to the plurality of passes, are taken into account.

In one embodiment, during the step of passing the glass sheet 110 through the etching zone 102a, the glass sheet 110 can be exposed to an etchant (e.g., first etchant 121a, second etchant 123a) including about 10% HF to about 20% HF. In another embodiment, during the step of passing the glass sheet 110 through the etching zone 102a, the glass sheet 110 can be exposed to an etchant (e.g., first etchant 121a, second etchant 123a) including about 15% HF to about 20% HF. In yet another embodiment, during the step of passing the glass sheet 110 through the etching zone 102a, the glass sheet 110 can be exposed to an etchant (e.g., first etchant 121a, second etchant 123a) including about 15% HF.

FIGS. 4-7 depict exemplary data with DOI on the Y-axis for various glass sheets, identified along the X-axis. Each plot includes a legend where "MN" identifies the minimum value in a set of data, "MX" identifies the maximum value in the set of data, "MD" represents the median value in the set of data, "Q1" is the first quartile of the set of data, and "Q3" is the third quartile in the set of data.

Figure 4:
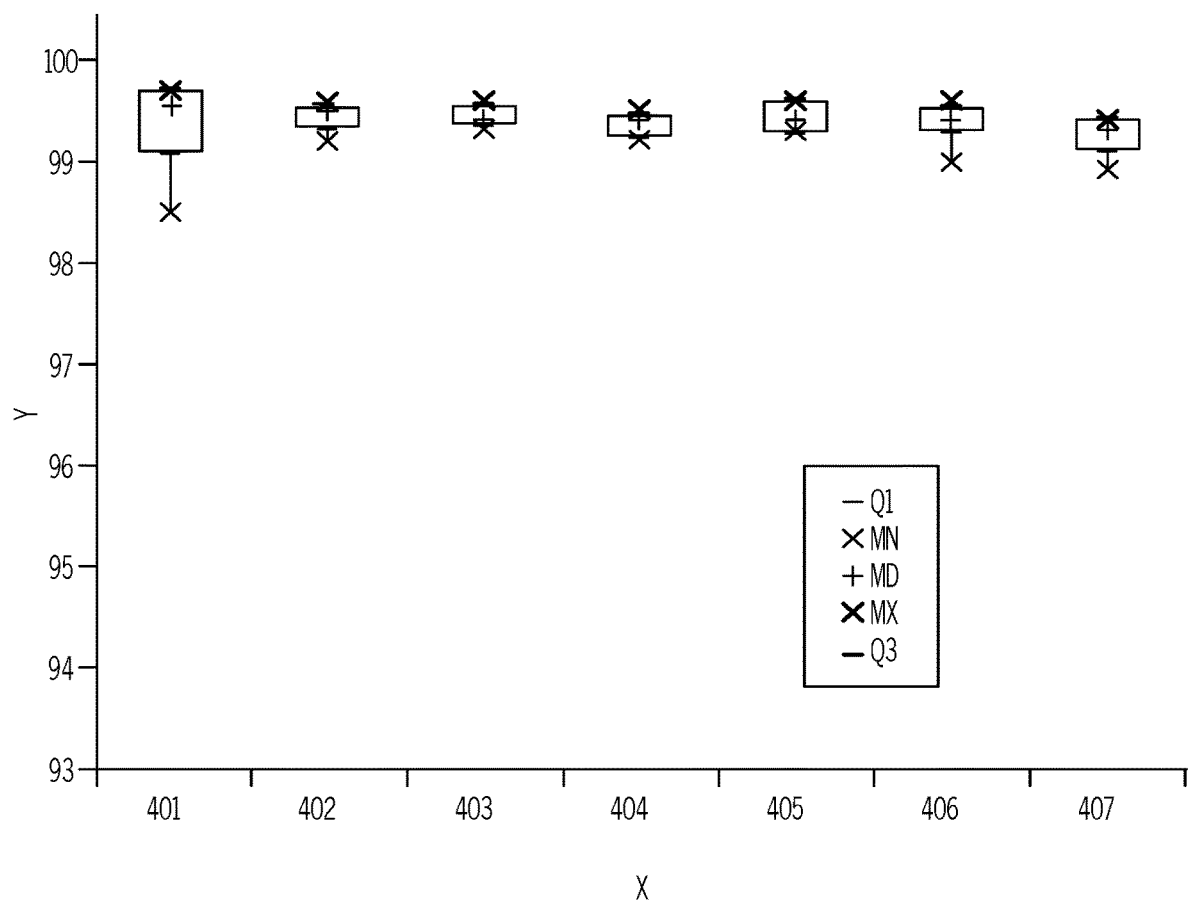
FIG. 4 shows a plot of DOI values obtained for glass sheets subjected to an exemplary etching process in accordance with embodiments described herein.

In particular, with reference to FIG. 4, 401 represents DOI data for a commercial screen protector used as a baseline against which to compare the other data; 402 represents DOI data for a glass sheet having an initial thickness of 200 microns, thinned to 100 microns, and subjected to an etchant including 15% HF, with 20 microns removed per pass; 403 represents DOI data for a glass sheet having an initial thickness of 200 microns, thinned to 100 microns, and subjected to an etchant including 15% HF, with 30 microns removed per pass; 404 represents DOI data for a glass sheet having an initial thickness of 200 microns, thinned to 100 microns, and subjected to an etchant including 15% HF, with 40 microns removed per pass; 405 represents DOI data for a glass sheet having an initial thickness of 200 microns, thinned to 69 microns, and subjected to an etchant including 15% HF, with 20 microns removed per pass; 406 represents DOI data for a glass sheet having an initial thickness of 200 microns, thinned to 69 microns, and subjected to an etchant including 15% HF, with 30 microns removed per pass; and 407 represents DOI data for a glass sheet having an initial thickness of 200 microns, thinned to 69 microns, and subjected to an etchant including 15% HF, with 40 microns removed per pass. As shown, all of the data points for each of 402, 403, 404, 405, 406, and 407 includes a DOI value that is greater than or equal to about 98.5 and thus comparable to the DOI data representative of the baseline commercial screen protector 401. It is to be understood that the data as well as the process parameters used to obtain the data of FIG. 4 are provided for exemplary purposes only and are not intended to limit the scope of the disclosure, unless otherwise noted.

As demonstrated by the data (e.g., each of 402, 403, 404, 405, 406, and 407) in FIG. 4, in one embodiment, a difference between the initial thickness 113 of the glass sheet 110 and the final predetermined thickness 115 of the glass sheet 110 can be greater than 0 microns and less than or equal to about 150 microns, and the method can further include the steps of controlling the etching process 100*a* to reduce the thickness 114 of the glass sheet 110 by about 20 microns to about 40 microns per each pass of the glass sheet 110 through the etching zone 102*a*, and controlling the etching process 100*a* to reduce the thickness 114 of the glass sheet 110 at a rate of from about 10 microns/min to about 15 microns/min per each pass of the glass sheet 110 through the etching zone 102*a*.

Figure 5:
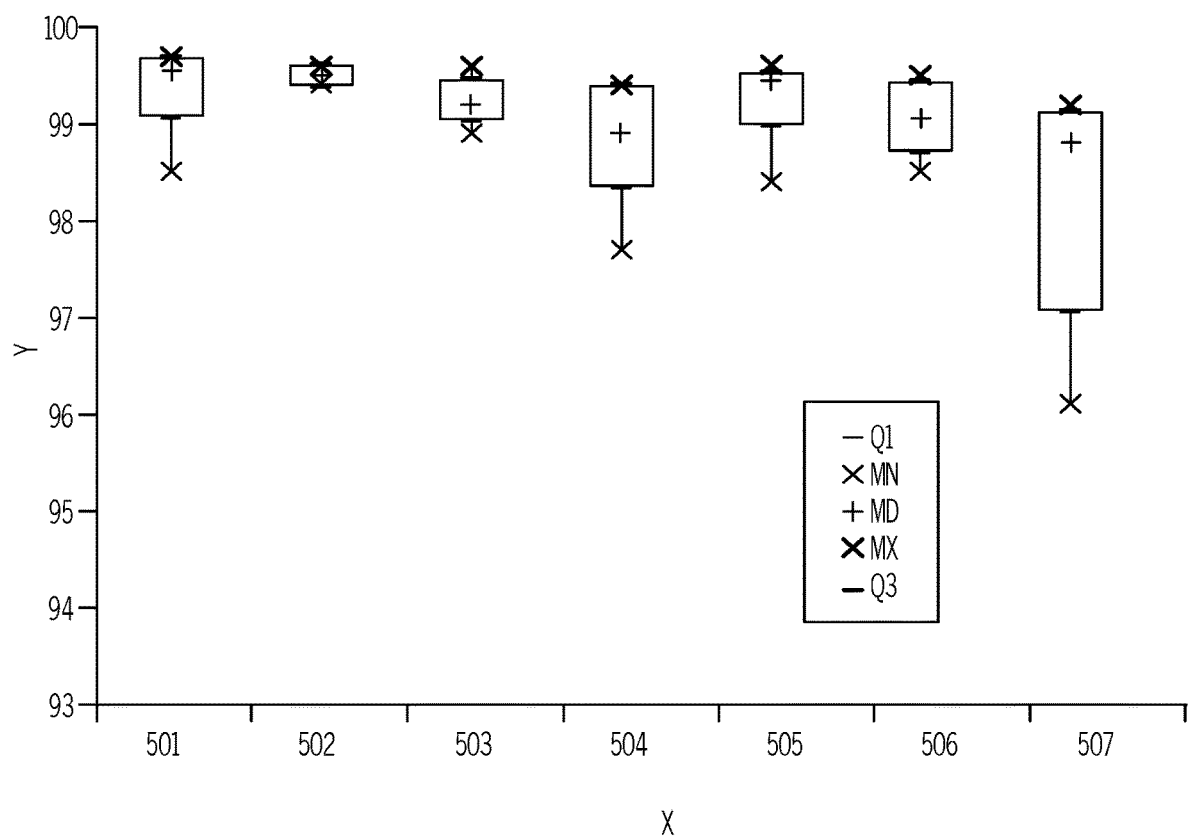
FIG. 5 shows another plot of DOI values obtained for glass sheets subjected to an exemplary etching process in accordance with embodiments described herein.

FIG. 5 shows DOI on the Y-axis for various glass sheets, identified along the X-axis. In particular, 501 represents DOI data for a commercial screen protector used as a baseline against which to compare the other data; 502 represents DOI data for a glass sheet having an initial thickness of 200 microns, thinned to 100 microns, and subjected to an etchant including 20% HF, with 20 microns removed per pass; 503 represents DOI data for a glass sheet having an initial thickness of 200 microns, thinned to 100 microns, and subjected to an etchant including 20% HF, with 30 microns removed per pass; 504 represents DOI data for a glass sheet having an initial thickness of 200 microns, thinned to 100 microns, and subjected to an etchant including 20% HF, with 40 microns removed per pass; 505 represents DOI data for a glass sheet having an initial thickness of 200 microns, thinned to 69 microns, and subjected to an etchant including 20% HF, with 20 microns removed per pass; 506 represents DOI data for a glass sheet having an initial thickness of 200 microns, thinned to 69 microns, and subjected to an etchant including 20% HF, with 30 microns removed per pass; and 507 represents DOI data for a glass sheet having an initial thickness of 200 microns, thinned to 69 microns, and subjected to an etchant including 20% HF, with 40 microns removed per pass. As shown, all of the data points for each of 502, 503, 505, and 506 includes a DOI value that is greater than or equal to about 98.5 and thus comparable to the DOI data representative of the baseline commercial screen protector 501; whereas each of 504 and 507 includes at least one data point with a DOI value less than about 98.5 and thus not comparable to the DOI data representative of the baseline commercial screen protector 501. It is to be understood that the data as well as the process parameters used to obtain the data of FIG. 5 are provided for exemplary purposes only and are not intended to limit the scope of the disclosure, unless otherwise noted.

As demonstrated by the data (e.g., each of 502, 503, 505, and 506) in FIG. 5, in another embodiment, a difference between the initial thickness 113 of the glass sheet 110 and the final predetermined thickness 115 of the glass sheet 110 can be greater than 0 microns and less than or equal to about 150 microns, and the method can further include the steps or controlling the etching process 100*a* to reduce the thickness 114 of the glass sheet 110 by about 20 microns to about 30 microns per each pass of the glass sheet 110 through the etching zone 102*a*, and controlling the etching process 100*a* to reduce the thickness 114 of the glass sheet 110 at a rate of from about 10 microns/min to about 20 microns/min per each pass of the glass sheet 110 through the etching zone 102*a*.

Figure 6:
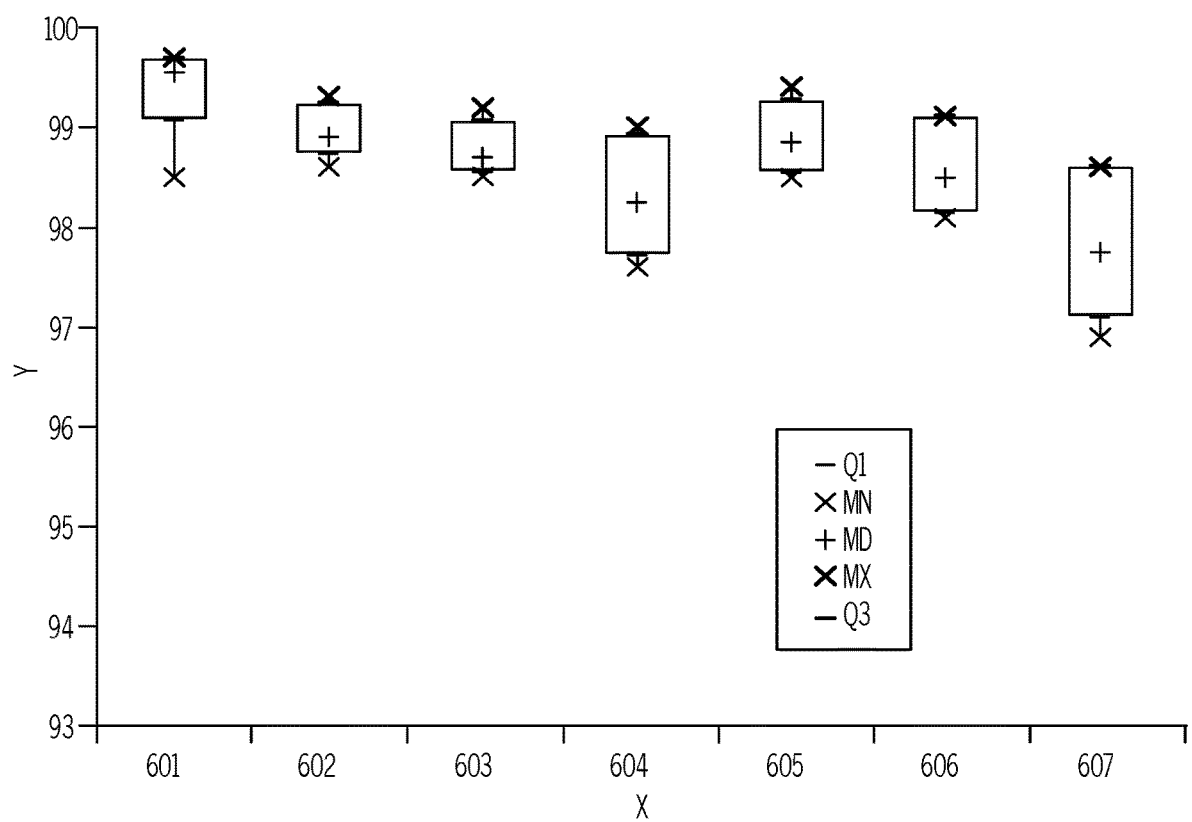
FIG. 6 shows yet another plot of DOI values obtained for glass sheets subjected to an exemplary etching process in accordance with embodiments described herein.

FIG. 6 shows DOI data on the Y-axis for various glass sheets, identified along the X-axis. In particular, 601 represents DOI data for a commercial screen protector used as a baseline against which to compare the other data; 602 represents DOI data for a glass sheet having an initial thickness of 400 microns, thinned to 100 microns, and subjected to an etchant including 15% HF, with 20 microns removed per pass; 603 represents DOI data for a glass sheet having an initial thickness of 400 microns, thinned to 100 microns, and subjected to an etchant including 15% HF, with 30 microns removed per pass; 604 represents DOI data for a glass sheet having an initial thickness of 400 microns, thinned to 100 microns, and subjected to an etchant including 15% HF, with 40 microns removed per pass; 605 represents DOI data for a glass sheet having an initial thickness of 400 microns, thinned to 69 microns, and subjected to an etchant including 15% HF, with 20 microns removed per pass; 606 represents DOI data for a glass sheet having an initial thickness of 400 microns, thinned to 69 microns, and subjected to an etchant including 15% HF, with 30 microns removed per pass; and 607 represents DOI data for a glass sheet having an initial thickness of 400 microns, thinned to 69 microns, and subjected to an etchant including 15% HF, with 40 microns removed per pass. As shown, all of the data points for each of 602, 603, 605, and 606 includes a DOI value greater than or equal to about 98.5 and thus comparable to the DOI data representative of the baseline commercial screen protector 601; whereas each of 604 and 607 includes at least one data point with a DOI value less than about 98.5 and thus not comparable to the DOI data representative of the baseline commercial screen protector 601. It is to be understood that the data as well as the process parameters used to obtain the data of FIG. 6 are provided for exemplary purposes only and are not intended to limit the scope of the disclosure, unless otherwise noted.

As demonstrated by the data (e.g., each of 602 and 603) in FIG. 6, in yet another embodiment, a difference between the initial thickness 113 of the glass sheet 110 and the final predetermined thickness 115 of the glass sheet 110 can be greater than about 150 microns and less than or equal to about 300 microns, and the method can further include the steps of controlling the etching process 100*a* to reduce the thickness 114 of the glass sheet 110 by about 20 microns to about 30 microns per each pass of the glass sheet 110 through the etching zone 102*a*, and controlling the etching process 100*a* to reduce the thickness 114 of the glass sheet 110 at a rate of from about 10 microns/min to about 15 microns/min per each pass of the glass sheet 110 through the etching zone 102*a*.

In addition, as demonstrated by the data (e.g., each of 605 and 606) in FIG. 6, in still another embodiment, a difference between the initial thickness 113 of the glass sheet 110 and the final predetermined thickness 115 of the glass sheet 110 can be greater than about 300 microns, and the method can further include the steps of controlling the etching process 100*a* to reduce the thickness 114 of the glass sheet 110 by greater than 0 microns to less than about 30 microns per each pass of the glass sheet 110 through the etching zone 102a, and controlling the etching process 100a to reduce the thickness 114 of the glass sheet 110 at a rate of from about 10 microns/min to about 15 microns/min per each pass of the glass sheet 110 through the etching zone 102a.

Figure 7:
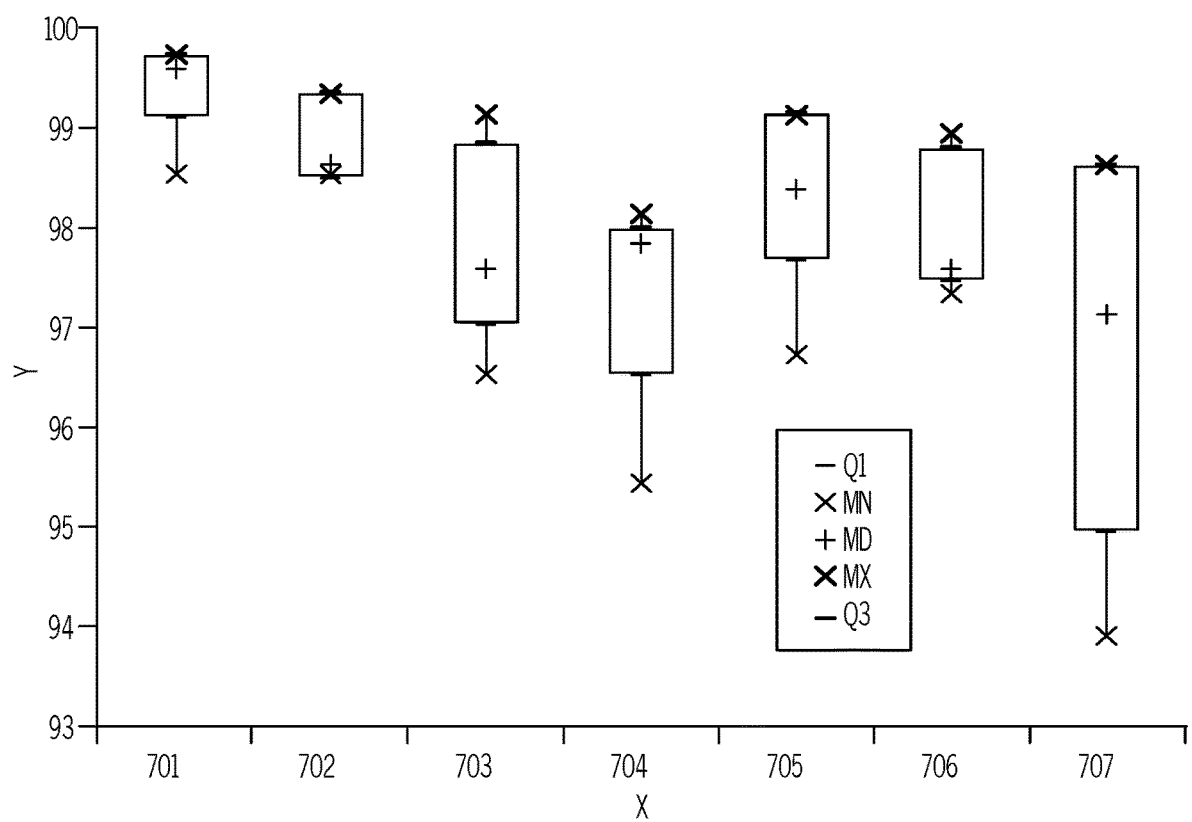
FIG. 7 shows still another plot of DOI values obtained for glass sheets subjected to an exemplary etching process in accordance with embodiments described herein.

FIG. 7 shows DOI data on the Y-axis for various glass sheets, identified along the X-axis. In particular, 701 represents DOI data for a commercial screen protector used as a baseline against which to compare the other data; 702 represents DOI data for a glass sheet having an initial thickness of 400 microns, thinned to 100 microns, and subjected to an etchant including 20% HF, with 20 microns removed per pass; 703 represents DOI data for a glass sheet having an initial thickness of 400 microns, thinned to 100 microns, and subjected to an etchant including 20% HF, with 30 microns removed per pass; 704 represents DOI data for a glass sheet having an initial thickness of 400 microns, thinned to 100 microns, and subjected to an etchant including 20% HF, with 40 microns removed per pass; 705 represents DOI data for a glass sheet having an initial thickness of 400 microns, thinned to 69 microns, and subjected to an etchant including 20% HF, with 20 microns removed per pass; 706 represents DOI data for a glass sheet having an initial thickness of 400 microns, thinned to 69 microns, and subjected to an etchant including 20% HF, with 30 microns removed per pass; and 707 represents DOI data for a glass sheet having an initial thickness of 400 microns, thinned to 69 microns, and subjected to an etchant including 20% HF, with 40 microns removed per pass. As shown, all of the data points of 702 include a DOI value greater than or equal to about 98.5 and thus comparable to the DOI data representative of the baseline commercial screen protector 701; whereas each of 703, 704, 705, 706, and 707 includes at least one data point with a DOI value less than about 98.5 and thus not comparable to the DOI data representative of the baseline commercial screen protector 701. It is to be understood that the data as well as the process parameters used to obtain the data of FIG. 7 are provided for exemplary purposes only and are not intended to limit the scope of the disclosure, unless otherwise noted.

As demonstrated by the data (e.g., 702) in FIG. 7, in yet another embodiment, a difference between the initial thickness 113 of the glass sheet 110 and the final predetermined thickness 115 of the glass sheet 110 can be greater than about 150 microns and less than or equal to about 300 microns, and the method can further include the steps of controlling the etching process 100a to reduce the thickness 114 of the glass sheet 110 by about 20 microns per each pass of the glass sheet 110 through the etching zone 102a, and controlling the etching process 100a to reduce the thickness 114 of the glass sheet 110 at a rate of from about 10 microns/min to about 20 microns/min per each pass of the glass sheet 110 through the etching zone 102a.

The glass sheet 110 disclosed herein can be separated from a larger glass sheet or can be separated from a glass ribbon fabricated, for example, by flowing molten glass to a forming body and producing the glass ribbon with any ribbon forming process including slot draw, float, down-draw, fusion down-draw, or up-draw. In some embodiments, the glass sheet 110 can be subjected to the etching process 100a once separated from the glass ribbon without any prior processing. In other embodiments, the glass sheet 110 can be pre-thinned to an intermediate thickness (e.g., corresponding to the initial thickness 113 of the glass sheet 110) using one or more of a conventional etching or mechanical polishing process and then subjected to the etching process 100a disclosed herein. In other embodiments, after being subjected to the etching process 100a, the glass sheet 110 can undergo an ion-exchange process to increase at least one of a surface strength and an edge strength of the glass sheet 110.

Many variations and modifications may be made to the above-described embodiments without departing substantially from the spirit and various principles described herein. All such modifications and variations are intended to be included herein within the scope of this disclosure and the following claims. Thus, it will be apparent to those skilled in the art that various modifications and variations can be made without departing from the spirit and scope of the claimed subject matter.

What is claimed is:

1. A method of reducing a thickness of a glass sheet by subjecting the glass sheet to an etching process comprising the steps of:
    loading the glass sheet onto a conveyor with the glass sheet comprising a first major surface and a second major surface;
    passing the glass sheet through an etching zone along a conveyance path with the conveyor a plurality of times until an initial thickness of the glass sheet is reduced to a final predetermined thickness of the glass sheet;
    flipping the glass sheet by rotating the glass sheet 180 degrees about an axis parallel to the first major surface of the glass sheet between two consecutive passes through the etching zone; and
    washing the glass sheet after each pass through the etching zone.

2. The method of claim 1, wherein the etching zone comprises a plurality of etching zones, the glass sheet is passed through each of the plurality of etching zones along the conveyance path with the conveyor at least once to comprise the plurality of times, and the glass sheet is washed after each pass through each of the plurality of etching zones.

3. The method of claim 1, further comprising the steps of:
    exposing the first major surface of the glass sheet to a first etchant and exposing the second major surface of the glass sheet to a second etchant during a first pass of the glass sheet through the etching zone; and then
    exposing the first major surface of the glass sheet to the second etchant and exposing the second major surface of the glass sheet to the first etchant during a subsequent pass of the glass sheet through the etching zone.

4. The method of claim 3, wherein the first etchant is provided to the glass sheet from a top sprayer arranged above the conveyance path with the first major surface facing the top sprayer, and wherein the second etchant is provided to the glass sheet from a bottom sprayer arranged below the conveyance path with the second major surface facing the bottom sprayer.

5. The method of claim 4, wherein a first flow rate of the first etchant from the top sprayer is less than a second flow rate of the second etchant from the bottom sprayer.

6. The method of claim 1, further comprising the step of:
    reorienting the glass sheet by rotating the glass sheet 180 degrees about an axis perpendicular to the first major surface of the glass sheet prior to a subsequent pass through the etching zone.

7. The method of claim 1, further comprising the step of:
    at least one of flipping the glass sheet by rotating the glass sheet 180 degrees about the axis parallel to the first major surface of the glass sheet and reorienting the glass sheet by rotating the glass sheet 180 degrees about an axis perpendicular to the first major surface of the glass sheet between each consecutive pass through the etching zone.

8. The method of claim 1, wherein the glass sheet comprising the final predetermined thickness comprises a DOI that is greater than or equal to about 98.5.

9. The method of claim 8, wherein the DOI is obtained without subjecting the glass sheet to a mechanical polishing process.

10. The method of claim 1, wherein at least one of a thickness variability of the final predetermined thickness of the glass sheet is from about 3 microns to about 9 microns and an absolute value of a difference between a first thickness variability of the initial thickness of the glass sheet and a second thickness variability of the final predetermined thickness of the glass sheet is from about 0 microns to about 7 microns.

11. The method of claim 10, wherein the at least one of the thickness variability and the first thickness variability and the second thickness variability is obtained without subjecting the glass sheet to a mechanical polishing process.

12. The method of claim 1, further comprising the step of:
controlling the etching process to reduce the thickness of the glass sheet by about 20 microns to about 40 microns per each pass of the glass sheet through the etching zone.

13. The method of claim 1, further comprising the step of:
controlling the etching process to reduce the thickness of the glass sheet at a rate of from about 10 microns/min to about 20 microns/min per each pass of the glass sheet through the etching zone.

14. The method of claim 1, wherein a difference between the initial thickness of the glass sheet and the final predetermined thickness of the glass sheet is greater than 0 microns and less than or equal to about 150 microns, further comprising the steps of:
controlling the etching process to reduce the thickness of the glass sheet by about 20 microns to about 40 microns per each pass of the glass sheet through the etching zone; and
controlling the etching process to reduce the thickness of the glass sheet at a rate of from about 10 microns/min to about 15 microns/min per each pass of the glass sheet through the etching zone.

15. The method of claim 1, wherein a difference between the initial thickness of the glass sheet and the final predetermined thickness of the glass sheet is greater than 0 microns and less than or equal to about 150 microns, further comprising the steps of:
controlling the etching process to reduce the thickness of the glass sheet by about 20 microns to about 30 microns per each pass of the glass sheet through the etching zone; and
controlling the etching process to reduce the thickness of the glass sheet at a rate of from about 10 microns/min to about 20 microns/min per each pass of the glass sheet through the etching zone.

16. The method of claim 1, wherein a difference between the initial thickness of the glass sheet and the final predetermined thickness of the glass sheet is greater than about 150 microns and less than or equal to about 300 microns, further comprising the steps of:
controlling the etching process to reduce the thickness of the glass sheet by about 20 microns to about 30 microns per each pass of the glass sheet through the etching zone; and
controlling the etching process to reduce the thickness of the glass sheet at a rate of from about 10 microns/min to about 15 microns/min per each pass of the glass sheet through the etching zone.

17. The method of claim 1, wherein a difference between the initial thickness of the glass sheet and the final predetermined thickness of the glass sheet is greater than about 150 microns and less than or equal to about 300 microns, further comprising the steps of:
controlling the etching process to reduce the thickness of the glass sheet by about 20 microns per each pass of the glass sheet through the etching zone; and
controlling the etching process to reduce the thickness of the glass sheet at a rate of from about 10 microns/min to about 20 microns/min per each pass of the glass sheet through the etching zone.

18. The method of claim 1, wherein a difference between the initial thickness of the glass sheet and the final predetermined thickness of the glass sheet is greater than about 300 microns, further comprising the steps of:
controlling the etching process to reduce the thickness of the glass sheet by greater than 0 microns to less than about 30 microns per each pass of the glass sheet through the etching zone; and
controlling the etching process to reduce the thickness of the glass sheet at a rate of from about 10 microns/min to about 15 microns/min per each pass of the glass sheet through the etching zone.

19. The method of claim 1, wherein during the step of passing the glass sheet through the etching zone, the glass sheet is exposed to an etchant comprising about 10% HF to about 20% HF.

20. The method of claim 1, further comprising the steps of:
passing the glass sheet through an isolation region along the conveyance path with the conveyor after exiting the etching zone, the glass sheet configured to be rinsed within the isolation region;
passing the glass sheet through a wash chamber along the conveyance path with the conveyor after exiting the isolation region, the glass sheet configured to be washed within the wash chamber to remove an etchant from the glass sheet; and then
passing the glass sheet through a dry chamber along the conveyance path with the conveyor after exiting the wash chamber, the glass sheet configured to be dried within the dry chamber.

21. A method of reducing a thickness of a glass sheet by subjecting the glass sheet to an etching process comprising the steps of:
loading the glass sheet onto a conveyor with the glass sheet comprising a first major surface and a second major surface;
passing the glass sheet through an etching zone along a conveyance path with the conveyor a plurality of times until an initial thickness of the glass sheet is reduced to a final predetermined thickness of the glass sheet;
reorienting the glass sheet by rotating the glass sheet 180 degrees about an axis perpendicular to the first major surface of the glass sheet between two consecutive passes through the etching zone; and
washing the glass sheet after each pass through the etching zone.

22. A method of reducing a thickness of a glass sheet by subjecting the glass sheet to an etching process comprising the steps of:

loading the glass sheet onto a conveyor with the glass sheet comprising a first major surface and a second major surface;

passing the glass sheet through an etching zone along a conveyance path with the conveyor a plurality of times until an initial thickness of the glass sheet is reduced to a final predetermined thickness of the glass sheet;

exposing the first major surface of the glass sheet to a first etchant and exposing the second major surface of the glass sheet to a second etchant during a pass of the glass sheet through the etching zone, wherein the first etchant is provided to the glass sheet from a top sprayer arranged above the conveyance path with the first major surface facing the top sprayer, and wherein the second etchant is provided to the glass sheet from a bottom sprayer arranged below the conveyance path with the second major surface facing the bottom sprayer;

flipping the glass sheet by rotating the glass sheet 180 degrees about an axis parallel to the first major surface of the glass sheet after the pass through the etching zone;

reorienting the glass sheet by rotating the glass sheet 180 degrees about an axis perpendicular to the first major surface of the glass sheet after the pass through the etching zone; and then exposing the first major surface of the glass sheet to the second etchant and exposing the second major surface of the glass sheet to the first etchant during a subsequent pass of the glass sheet through the etching zone; and washing the glass sheet after each pass through the etching zone;

wherein a first flow rate of the first etchant from the top sprayer is less than a second flow rate of the second etchant from the bottom sprayer.

* * * * *